US005682044A

United States Patent [19]

Tamamushi et al.

[11] Patent Number: 5,682,044

[45] Date of Patent: Oct. 28, 1997

[54] REVERSE CONDUCTING THYRISTOR WITH A PLANAR-GATE, BURIED-GATE, OR RECESSED-GATE STRUCTURE

[75] Inventors: Takashige Tamamushi, 2-18-17, Shimo-Ochiai, Shinjuku-Ku, Tokyo 161; Kimihiro Muraoka, Kanagawa-ken; Yoshiaki Ikeda, Kanagawa-ken; Keun Sam Lee, Kanagawa-ken; Naohiro Shimizu, Kanagawa-ken; Masashi Yura, Tokyo; Kinji Yoshioka, Kanagawa-ken, all of Japan

[73] Assignees: Takashige Tamamushi; Toyo Denki Seizo Kabushiki Kaisha, both of Tokyo, Japan

[21] Appl. No.: 591,420

[22] Filed: Jan. 19, 1996

[30] Foreign Application Priority Data

| | | | |
|---|---|---|---|
| Jan. 31, 1995 | [JP] | Japan | 7-034388 |
| Jan. 31, 1995 | [JP] | Japan | 7-034389 |

[51] Int. Cl.$^{6}$ .......................... H01L 29/74; H01L 31/111

[52] U.S. Cl. .......................... 257/147; 257/148; 257/149; 257/170; 257/157

[58] Field of Search .......................... 257/121–123, 257/127, 147, 148, 149–153, 170, 157

[56] References Cited

U.S. PATENT DOCUMENTS

| | | | |
|---|---|---|---|
| 4,150,391 | 4/1979 | Jaecklin | 257/127 |
| 5,324,966 | 6/1994 | Muraoka et al. . | |
| 5,471,074 | 11/1995 | Pezzani | 257/121 |

FOREIGN PATENT DOCUMENTS

| | | |
|---|---|---|
| 204434/93 | 2/1994 | Japan . |
| 210751/92 | 2/1994 | Japan . |
| 129678/92 | 10/1994 | Japan . |
| 342923/93 | 7/1995 | Japan . |
| 344125/93 | 7/1995 | Japan . |
| 114139/92 | 10/1995 | Japan . |
| 114140/92 | 10/1995 | Japan . |
| 194918/94 | 2/1996 | Japan . |
| 264663/94 | 4/1996 | Japan . |
| 337823/94 | 7/1996 | Japan . |

*Primary Examiner*—Wael Fahmy
*Assistant Examiner*—Fetsum Abraham
*Attorney, Agent, or Firm*—McGlew and Tuttle

[57] ABSTRACT

The present invention provides a reverse conducting (RC) thyristor of a planar-gate structure for low-and-medium power use which is relatively simple in construction because of employing a planar structure for each of thyristor and diode regions, permits simultaneous formation of the both region and have high-speed performance and a RC thyristor of a buried-gate or recessed-gate structure which has a high breakdown voltage by the use of a buried-gate or recessed-gate structure, permits simultaneous formation of thyristor and diode regions and high-speed, high current switching performance, and the RC thyristor of the planar-gate structure has a construction which comprises an SI thyristor or miniaturized GTO of a planar-gate structure in the thyristor region and an SI diode of a planar structure in the diode region, the diode region having at its cathode side a Schottky contact between n emitters or diode cathode shorted region and the thyristor region having at its anode side an SI anode shorted structure formed by $p^{+}$ anode layers, wave-shaped anode layers or anode $n^{+}$ layers; in the case of a high breakdown device, an n buffer layer is added; similarly the RC thyristor of the buried-gate or recessed-gate structure has a construction which comprises an SI thyristor of a buried-gate or recessed-gate structure at the thyristor region and an SI diode of the buried or recessed structure.

19 Claims, 33 Drawing Sheets

REVERSE CONDUCTING THYRISTOR WITH A PLANAR-GATE, BURIED-GATE, OR RECESSED-GATE STRUCTURE

BACKGROUND OF THE INVENTION

1. Field of the Invention

The present invention relates to the field of power semiconductor devices and, more particularly, to a relatively-easy-to-manufacture, reverse conducting (hereinafter referred to simply as RC) thyristor of a planar-gate structure for low-and-medium power use wherein a planer-structured static induction (hereinafter referred to simply as SI) diode is connected to a main thyristor of a planar-gate structure in an antiparallel relation thereto obtain a fast reverse recovery characteristic, or a RC thyristor of a buried-gate or recessed-gate structure for high power use wherein an SI diode of a buried-gate or recessed-gate structure is connected to a main thyristor of a buried-gate or recessed-gate structure in antiparallel relation thereto to obtain a fast reverse recovery characteristic and allow comparative ease in the simultaneous formation of the thyristor and diode regions.

2. Description of the Prior Art

Conventional RC thyristors mostly have a construction in which the main thyristor region is formed by a gate-turn-off thyristor (hereinafter referred to simply as GTO) and the diode region by an ordinary PN junction diode or PIN diode. On the other hand, reverse conducting static induction (hereinafter referred to simply as RC-SI) thyristors of the type having the main thyristor region formed by an SI thyristor are disclosed in, for instance, Japanese Pat. Appln. No. 342923/93 entitled "Reverse Conducting Thyristor", Japanese Pat. Appln. No. 344125/93 entitled "Reverse Conducting Thyristor with Field Limiting Isolation Region", Japanese Pat. Appln. No. 194918/94 entitled "Self Turn-Off Reverse Conducting Thyristor" and Japanese Pat. Appln. No. 264663/94 entitled "Reverse Conducting Semiconductor Device and Manufacturing Method Therefor" which have all been filed in the name of the assignee of this application.

The Inventors of this application have prototyped the RC-SI thyristor and found, in the designing and making of a high breakdown voltage RC-SI thyristor, that it is difficult to obtain a high value of a forward breakdown voltage or ensure stable manufacture of the RC-SI thyristor with reliability by the use of conventional techniques for the formation of an isolation region between thyristor and diode regions and for the formation of the diode region in reverse conducting GTO thyristors (hereinafter referred to simply as RC-GTO thyristors)—this is particularly difficult when the SI thyristor region is designed or formed to have a normally-ON characteristic.

As a solution to this problem, the inventors have proposed in Japanese Pat. Appln. No. 337823/94 an RC-SI thyristor of the type having an increased resistance of the isolation region between the thyristor and diode regions and an improved reverse recovery characteristic of the diode region. As pointed out in Japanese Pat. Appln. No. 337823/94, too, it is desirable that the diode region be formed by a high-speed diode that is consistent with the high-speed switching performance of the SI thyristor, excellent in reverse recovery characteristic and easy to obtain a high breakdown voltage. On the other hand, it is also necessary to take into account the fabrication process compatibility between the main thyristor region and the diode region.

Prior to the filing of the above-mentioned Japanese patent applications, the inventors of this application had already conducted studies of SI diodes having the high-voltage and high-speed switching properties and proposed an SI diode of a planar structure in Japanese Pat. Appln. No. 204434/92 and an SI diode of a buried or recessed structure in Japanese Pat. Appln. No. 210751/92.

In the case of forming the main thyristor region as a planar-structured GTO or SI thyristor, it is desirable that the diode region have the planar structure because of its simultaneous formation with the main thyristor region. Also in the case of forming the main thyristor region by the GTO, it is desirable to enhance the reverse recovery performance by forming the diode region as an SI diode which can be expected to deliver faster switching performance than does the GTO.

The thyristor of the buried-gate or recessed-gate structure is suitable for obtaining high current because it allows ease in obtaining a high breakdown voltage and in increasing the number of channels. When the main thyristor region is formed as the buried-gate or recessed-gate structure, it is desirable that the diode region also have a structure that can easily be formed simultaneously with the main thyristor region. When the main thyristor has a high-speed SI thyristor structure, it is desirable to form the diode region by an element which is adapted to high-speed operations of the main thyristor, small in the quantity of charges stored during the reverse recovery period, achieves the high-speed switching performance and high in breakdown voltage.

SUMMARY OF THE INVENTION

It is an object of the present invention to provide a RC thyristor of a planar-gate structure wherein an SI diode of the planar structure is connected to the main thyristor region of the planar-gate structure in antiparallel relation thereto to obtain a fast reverse recovery characteristic.

Another object of the present invention is to provide a simple-structured RC thyristor of a planar-gate structure for low-and-medium power use wherein the thyristor region is formed by a GTO of the planar-gate structure and an SI diode of the planar structure is connected thereto in antiparallel relation to obtain an excellent reverse recovery characteristic.

Another object of the present invention is to provide a RC thyristor of a planar-gate structure which is simple in construction and possesses fast reverse recovery performance by forming, as the thyristor region, an SI thyristor of the planar-gate structure and connecting thereto in antiparallel relation an SI diode of the planar structure that is adapted to high-speed operations of the main thyristor region.

Another object of the present invention is to provide a RC thyristor of a buried-gate or recessed-gate structure wherein the main thyristor region is formed as a thyristor of a buried-gate or recessed-gate structure and the diode region by an SI diode of a buried or recessed structure which can be formed simultaneously with the main thyristor region, having high breakdown voltage, high-speed, high current switching performance commensurate with that of the main thyristor region and having an excellent reverse recovery characteristic so that the RC thyristor is equipped with high current, high-speed switching performance as a whole.

Another object of the present invention is to provide a RC thyristor of a buried-gate or recessed-gate structure wherein the main thyristor region is formed by a GTO of the buried-gate or recessed-gate structure.

Another object of the present invention is to provide a RC thyristor of a buried-gate or recessed-gate structure wherein the main thyristor region is formed by an SI thyristor of the buried-gate or recessed-gate structure.

Another object of the present invention is to provide a RC thyristor wherein the main thyristor region and the diode region both have a buried-gate structure and hence can easily be form at the same time.

Still another object of the present invention is to provide a RC thyristor wherein the main thyristor region and the diode region both have a recessed-gate structure and hence can easily be formed at the same time.

In an aspect, the present invention is directed to a RC thyristor of a planar-gate structure which has a thyristor region and a diode region and wherein the thyristor region comprises a gate region formed in a first main surface of a semiconductor substrate, a cathode region formed in the first main substrate surface and surrounded by the gate region and a thyristor anode region formed in a second main surface of the semiconductor substrate and wherein the diode region comprises a diode anode region formed in the first main substrate surface, a diode anode shorted region formed in the first main substrate surface and surrounded by the diode anode region and a diode cathode region formed in the second main substrate surface. The diode anode region and the gate region formed in the first main substrate surface are isolated by an isolation region formed in the first main substrate surface. The diode cathode region and the thyristor anode region formed in the second main substrate surface are in contact with a global anode electrode formed on the second main substrate surface and are held equipotential. The thyristor anode region, the diode anode region and the diode anode shorted region are in contact with a global cathode region and are held equipotential. The diode anode shorted region, surrounded by the diode anode region, is also surrounded by a depletion layer which spreads in the semiconductor substrate owing to the contact potential difference of the PN junction between the diode anode region and the semiconductor substrate; the diode anode shorted region and the diode anode cathode region constitute an SI diode of a planar structure. The diode anode region, the diode anode shorted region, the thyristor gate region and the thyristor cathode region are each formed as a planar structure in the first main surface of the semiconductor substrate.

In another aspect, the present invention is directed to a RC thyristor of a planar-gate structure wherein the thyristor cathode region is formed in the thyristor gate region and constitute a GTO of a planar-gate structure in combination with the thyristor anode region.

In another aspect, the present invention is directed to a RC thyristor of a planar-gate structure wherein the thyristor cathode region, surrounded by the thyristor gate region, is also surrounded by a depletion layer which spreads in the semiconductor substrate owing to the contact potential difference of the PN junction between the thyristor gate region and the semiconductor subtrarte; the thyristor cathode region and the thyristor anode region constitute an SI thyristor of a planar-gate structure.

In another aspect of the present invention, the present invention is directed to a RC thyristor of a buried-gate structure which has a thyristor region and a diode region and wherein the thyristor region comprises a buried-gate region formed in a semiconductor substrate in the vicinity of its first main surface, a cathode region formed in the first main substrate surface above the buried-gate region with an epitaxial layer interposed therebetween and a thyristor anode region formed in a second main surface of the semiconductor substrate and wherein the diode region comprises a diode anode region formed in the semiconductor substrate in the vicinity of its first main surface, a diode anode shorted region formed in the first main substrate surface above the diode anode region with the above-mentioned epitaxial layer interposed therebetween and a diode cathode region formed in the second main substrate surface. The diode anode region and the buried-gate region formed in the vicinity of the first main substrate surface are isolated by an isolation region formed in the first main substrate region. The diode cathode region and the thyristor anode region formed in the second main substrate surface are in contact with a global anode electrode formed on the second main substrate surface and are held equipotential. The thyristor anode region, the diode anode region and the diode anode shorted region are in contact with a global cathode electrode and are held equipotential. The diode anode shorted region, surrounded by the diode anode region, is also surrounded and shielded by a depletion layer which spreads in the semiconductor substrate owing to the contact potential difference of the PN junction between the diode anode region and the semiconductor substrate; the diode anode shorted region and the diode cathode region constitute an SI diode of a buried structure. The diode anode region and the thyristor gate region are both formed as a buried structure in the vicinity of the main surface of the semiconductor substrate.

In another aspect, the present invention is directed to a RC thyristor of a buried-gate structure wherein the thyristor cathode region is formed in the first main surface of the semiconductor substrate above a thyristor base region including the buried-gate region and constitutes a GTO of a buried-gate structure in combination with the thyristor anode region.

In another aspect, the present invention is directed to a RC thyristor of a buried-gate structure wherein the thyristor cathode region is surrounded and shielded not only by the buried thyristor gate region but also by a depletion layer which spreads in the semiconductor substrate owing to the contact potential difference of the PN junction between the buried thyristor gate region and the semiconductor subtrate; the thyristor cathode region and the thyristor anode region constitute an SI thyristor of a buried-gate structure.

In another aspect, the present invention is directed to a RC thyristor of a recessed-gate structure which has a thyristor region and a diode region and wherein the thyristor region comprises a recessed-gate region formed in a semiconductor substrate in the vicinity of its first main surface, a cathode region formed in the first main substrate surface above the recessed-gate region with an epitaxial layer interposed therebetween and a thyristor anode region formed in a second main surface of the semiconductor substrate and wherein the diode region comprises a diode anode region of a recessed structure formed in the semiconductor substrate in the vicinity of its first main surface, a diode anode shorted region formed in the first main substrate surface above the diode anode region with an epitaxial layer interposed therebetween, the epitaxial layer being formed simultaneously with the above-mentioned one, and a diode cathode region formed in the second main substrate surface. The diode anode region and the buried-gate region formed in the semiconductor substrate in the vicinity of its first main surface are isolated by an isolation region formed in the first main substrate surface. The diode cathode region and the thyristor anode region formed in the second contact with a surface are in contact with a global anode electrode formed on the second main substrate surface and are held equipotential. The thyristor cathode region, the diode anode region and the diode anode shorted region are in contact with a global cathode electrode and are held equipotential. The diode anode shorted region is surrounded and shielded not only by the diode anode region of the recessed structure but also by a depletion layer which spreads in the semiconductor substrate owing to the contact potential difference of the PN junction between the diode anode region and the semiconductor substrate; the thyristor anode shorted region and the diode cathode region constitute an SI diode of a recessed structure. The diode anode region and the thyristor gate region are both formed as a recessed structure in the vicinity of the first main substrate surface.

In another aspect, the present invention is directed to a RC thyristor of a recessed-gate structure wherein the thyristor cathode region is formed in the first main substrate surface above a thyristor base region including the recessed-gate region and constitutes a GTO of a recessed-gate structure in combination with the thyristor anode region.

In still another aspect, the present invention is directed to a RC thyristor of a recessed-gate structure wherein the thyristor cathode region is surrounded and shielded not only by the buried thyristor gate region but also by a depletion layer which spreads in the semiconductor substrate owing to the contact potential difference of the PN junction between the thyristor gate region and the semiconductor substrate; the thyristor cathode region and the thyristor anode region constitute an SI thyristor of a recessed-gate structure.

The RC thyristor with a planar-gate structure according to the present invention performs the function of a switching device based on the antiparallel connection of the diode and thyristor regions each having the planar-gate structure. With the diode region formed by an SI diode of high-speed switching performance commensurate with high-speed operations of the thyristor region, the RC thrristor has excellent reverse recovery performance and is capable of high-speed switching.

The RC thyristor with a buried-gate or recessed-gate structure according to the present invention performs the function of a switching device based on the antiparallel connection of the diode and thyristor regions each having the buried-gate or recessed-gate structure. With the diode region formed by an SI diode of high-speed switching performance commensurate with high-speed operations of the thyristor region, the RC thyristor has excellent reverse recovery performance and is capable of high-speed switching.

The RC thyristor of the present invention has particularly excellent high breakdown voltage, high current switching performance through utilization of the buried or recessed structure. In view of the easiness of simultaneous formation of the thyristor and diode regions, it is desirable that when the thyristor region is formed as a buried-gate structure, the diode region be formed as a buried structure and that when the thyristor region is formed as a recessed-gate structure, the diode region be formed as a recessed structure.

Other objects, features and advantages of the present invention will become more apparent from the following description taken in conjunction with the accompanying drawings.

DESCRIPTION OF THE PREFERRED EMBODIMENTS

[Embodiment 1]

Figure 1:
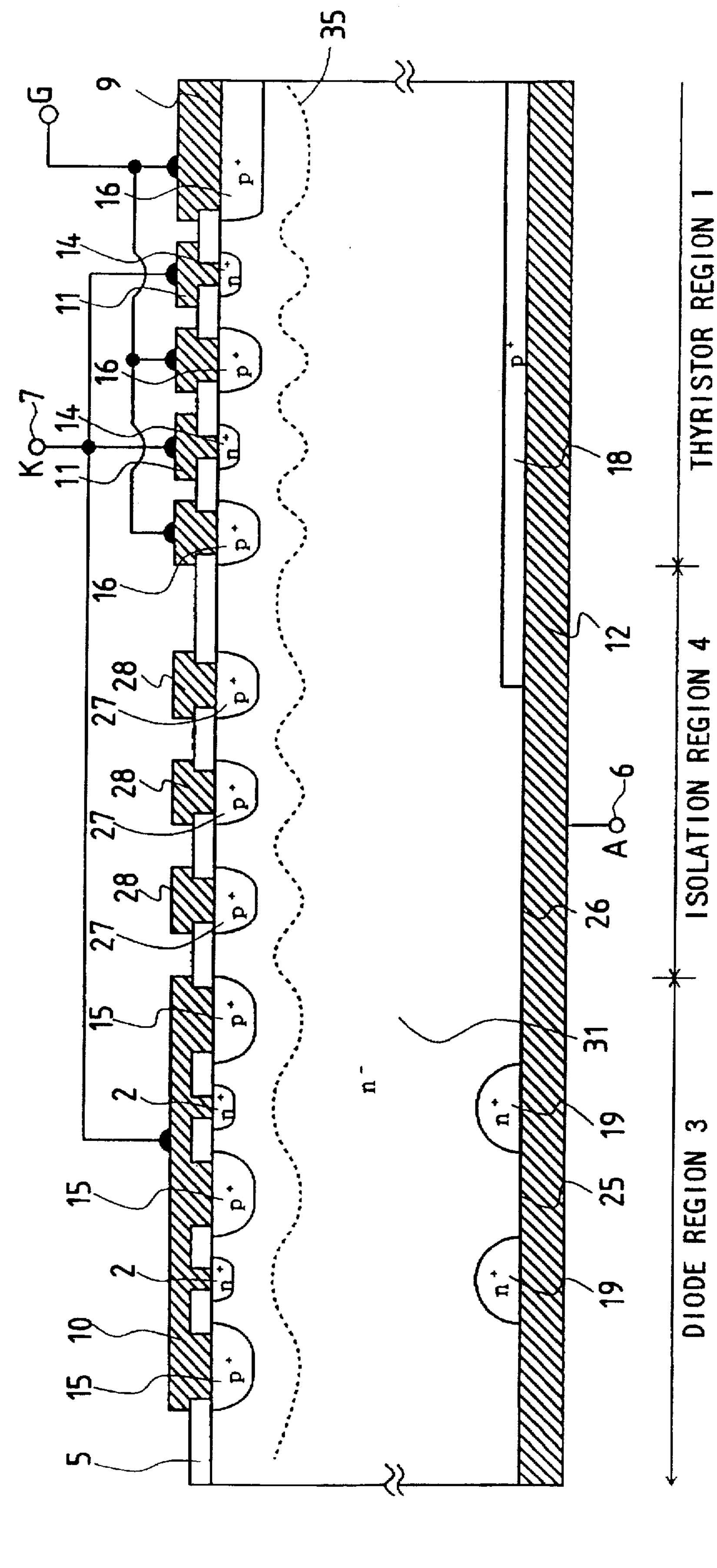
FIG. 1 is a sectional view schematically illustrating a RC thyristor with a planar-gate structure according to a first embodiment of the present invention.

FIG. 1 schematically illustrates, in section, a RC thyristor with a planar-gate structure according to a first embodiment of the present invention, which has a thyristor region formed by an SI thyristor of a planar-gate structure and a diode region formed by an SI diode of a planar structure.

In FIG. 1 reference numerals 1, 3 and 4 denote a thyristor region, a diode region and an isolation region all formed in a high-resistivity semiconductor substrate 31, respectively. In a first main surface of the high-resistivity semiconductor substrate (an n base layer) 31, there are formed p base (gate) layers 16 and n emitter (cathode) layers 14 of the thyristor region 1, p emitter (anode) layers 15 and diode anode shorted regions 2 of the diode region and $p^+$ layers 27 of the isolation region 4. In a second main surface of the high-resistivity semiconductor substrate 31 there are formed a p emitter (anode) layer 18 and n emitter (cathode) layers 19 of the diode region 3. In the isolation region 4 there is formed an isolation Schottky contact 26. In this embodiment there is formed a Schottky contact 25 between the n emitter layers 19 of the diode region 3. The function of the Schottky contact 25 is to suppress the injection of electrons from the diode cathode and to promote the absorption of holes by a diode cathode electrode 12 (a global anode electrode) which are injected from the diode anode region (p emitter layer 15). The isolation Schottky contact 26 is to suppress latch-up in the isolation region 4 and to prevent an extra injection of electrons into the diode region 3.

In the RC thyristor, a diode anode electrode 10 is held equipotential with a thyristor cathode electrode 11 via a global cathode electrode 7, and the diode cathode electrode 12 is held equipotential with the thyristor anode electrode 12 via a global anode electrode 6. Further, the diode anode shorted region 2, which is characteristic of the RC thyristor according to the present invention, is shorted to the diode anode region 15 via the diode anode electrode 10. With the effect of shorting by diode anode shorted region 2, electrons which are distributed near the anode region 15 of the diode region 3 can be absorbed to the diode anode electrode 10 via the diode anode shorted region 2. Electrons in an $n^-$ layer (31) near the $n^+$ diode anode shorted region 2, surrounded by a depletion layer spreading from the diode anode region 15 into the high-resistivity layer ($n^-$) 31, are surrounded by a potential barrier during the reverse recovery of the diode by switching; hence, the electrons are not injected into the diode cathode side but are rather absorbed by the diode anode electrode 10. This reduces the quantity of charges stored during the reverse recovery period and improves the reverse recovery performance of the diode, providing a high-speed switching characteristic. When a high-speed thyristor such as an SI thyristor is used as the main thyristor, it is desirable to use a diode which is small in the quantity of charges stored during the reverse recovery period, small in heating value and can be turned off at high speed.

The FIG. 1 embodiment employs an SI diode of the planar structure in the diode region 3 and an SI thyristor of the planar-gate structure in the main thyristor region 1, and hence can be manufactured with much ease. What is more important resides in that the SI diode can be expected to have switching performance substantially comparable to that of the SI thyristor which is dependent on the RC time constant between its gate and cathode at the input side, since the diode region 3 can be formed with a pattern pitch reduced down to about the same extent as that usable for the formation of the gate of the thyristor of the planar-gate structure. In terms of the operation of the SI diode the absorption of electrons from the $n^+$ diode anode region 2 significantly affects the reverse recovery characteristic of the SI diode as referred to previously; yet the SI diode manufactured with the same pitch as that of the SI thyristor can be expected to produce the same SI effect as that by the SI thyristor. This is associated with the rate at which the depletion layer spreads into the high-resistivity layer 31 from the diode anode region 15, and during the reverse recovery period of the diode it is desirable that the $n^+$ shorted region 2 be immediately shielded by the depletion layer which spreads into the $n^-$ layer (31) from the $p^+$ layer (15). To perform this, it is necessary that the $p^+$ diode anode region 15 and the $n^+$ diode anode shorted region 2 of the diode region be formed in the same manner as the gate and cathode of the SI thyristor of the planar-gate structure.

In the FIG. 1 embodiment the thyristor region 1 has the p emitter layer 18 at the anode side. The suppression of a tail current at the turn-OFF of the thyristor is an important parameter for enhancement of the switching characteristic. Also in the RC-SI thyristor, the tail current needs to be suppressed; lifetime control by irradiation with an electron beam or the like is necessary in the FIG. 1 embodiment, too.

At the cathode side of the diode region 3 there are disposed n emitter layers 19 in the form of stripes of islands with a view to suppressing the injection of electrons from the diode cathode side and increasing the hole absorption efficiency as mentioned previously.

In the isolation region 4 there are disposed in the first main surface of the substrate 31 the plurality of ring-shaped $p^+$ layers 27 surrounding the main thyristor region 1. The $p^+$ layers 27 are equally spaced apart. To maintain potential stability, metal electrodes 28 are each deposited on one of the $p^+$ layers 27.

Since the device structure of the FIG. 1 embodiment can be manufactured by a planar process, the $p^+$ regions 15, 27 and 16 of the diode, isolation and thyristor regions 3, 4 and 1 can be simultaneously formed by selectively removing an insulating layer 5 as of $SiO_2$ through patterning to form windows and diffusing an impurity therethrough into the semiconductor substrate 31. In this case, ions of boron (B) may also be implanted. Similarly, the $n^+$ regions 2 and 14 of the diode and thyristor regions 3 and 1 are also simultaneously formed by thermal diffusion from doped silicon or implantation of ions of phosphorus (P), arsenic (As) or the like. The isolation region 4 is shown to have three $p^+$ layers 27 but need not be limited specifically to the illustrated structure and may also be formed as a structure called a successively interconnected junction structure disclosed in, for example, Japanese Pat. Appln. No. 337823/94 entitled "Reverse Conducting Static Induction Thyristor" filed in the name of the assignee of this application. Other simple structures can be used for the isolation region as long as they have fabrication process compatibility with the main thyristor region 1 and the diode region 3.

[Embodiment 2]

Figure 2:
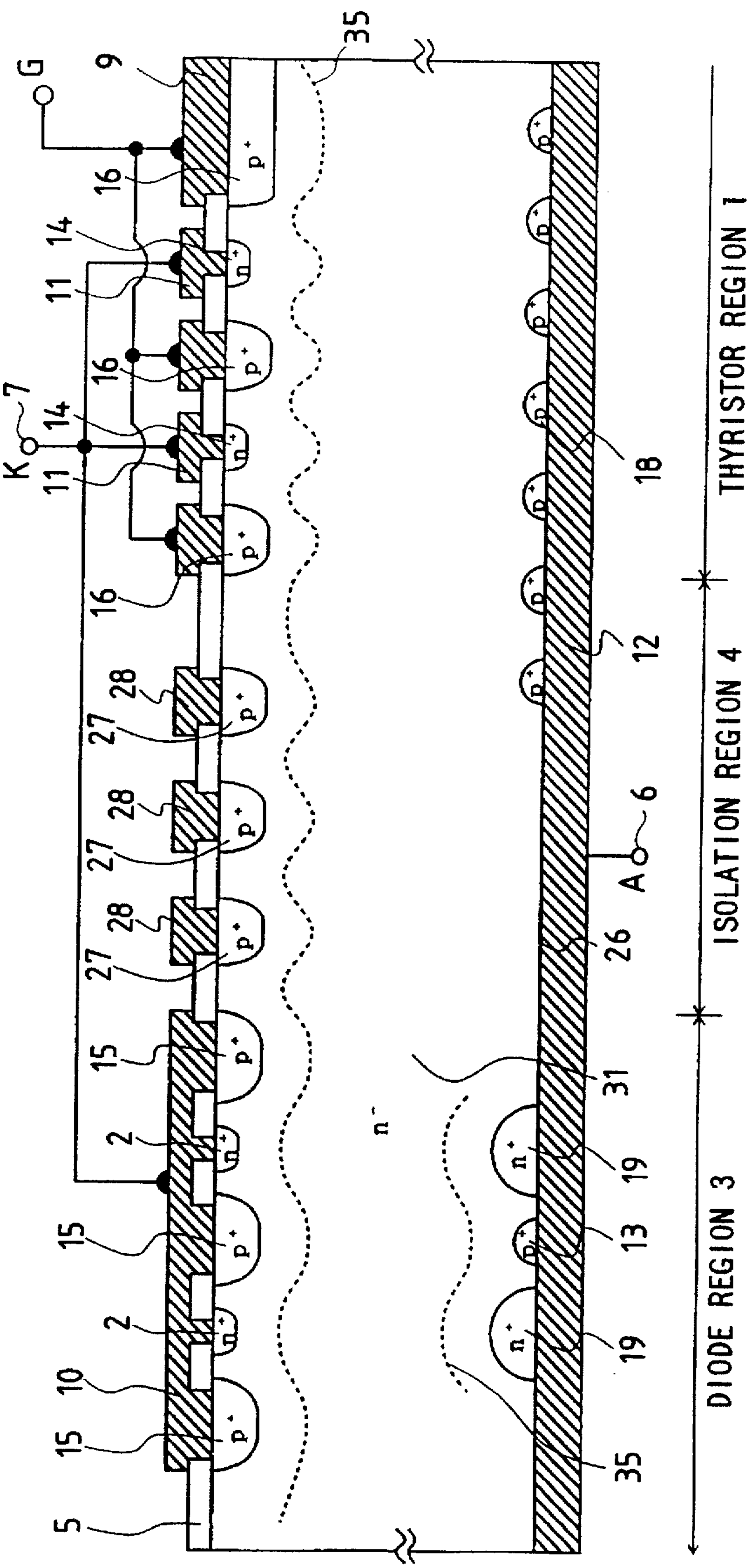
FIG. 2 is a sectional view schematically illustrating a RC thyristor with a planar-gate structure according to a second embodiment of the present invention.

FIG. 2 schematically illustrates, in section, the RC thyristor of the planar-gate structure according to a second embodiment of the present invention. This embodiment is common to the FIG. 1 embodiment in the construction of the first main surface region of the high-resistivity semiconductor substrate 31 but differs in the construction of the second main surface region (at the anode side) of the substrate 31. That is, at the anode side of the thyristor region 1, there are disposed wave-shaped $p^+$ emitter layers 18 with about the same pitch as or a little smaller than the pitch of the p base layers (gate layers) 16. The waves-shaped $p^+$ emitter layers 18 improve the efficiency of absorption of electrons by the thyristor anode electrode 12 from the $n^-$ layer surrounded by the $p^+$ emitter layers 18.

On the other hand, at the cathode side of the diode region 3 there is formed a $p^+$ diode cathode shorted region 13 between the n emitter layers 19 spaced a predetermined distance apart. The $p^+$ diode cathode shorted region 13 is a region for effectively absorbing holes in the vicinity of the cathode of the diode region 3 by the diode cathode electrode (the global anode electrode) 12 during the reverse recovery period of the diode. The $p^+$ diode cathode shorted region 13 is shielded by a depletion layer that spreads in the high-resistivity semiconductor substrate 31 by virtue of the contact potential difference of the PN junction between the n emitter layers 19 and the substrate 31. This embodiment has a construction that reduces the quantity of charges stored during the reverse recovery period of the diode by absorbing holes from the vicinity of the cathode of the diode region 3 through the $p^+$ diode cathode shorted region 13 and by absorbing electrons from the vicinity of the anode of the diode region 3 through the $n^+$ diode anode shorted regions 2. Charges that remain unabsorbed in the central part of the high-resistivity semiconductor substrate 31 can be reduced by a lifetime killer using lifetime control techniques. The device construction of this embodiment permits simultaneous formation of the $p^+$ regions 13 and 18.

[Embodiment 3]

Figure 3:
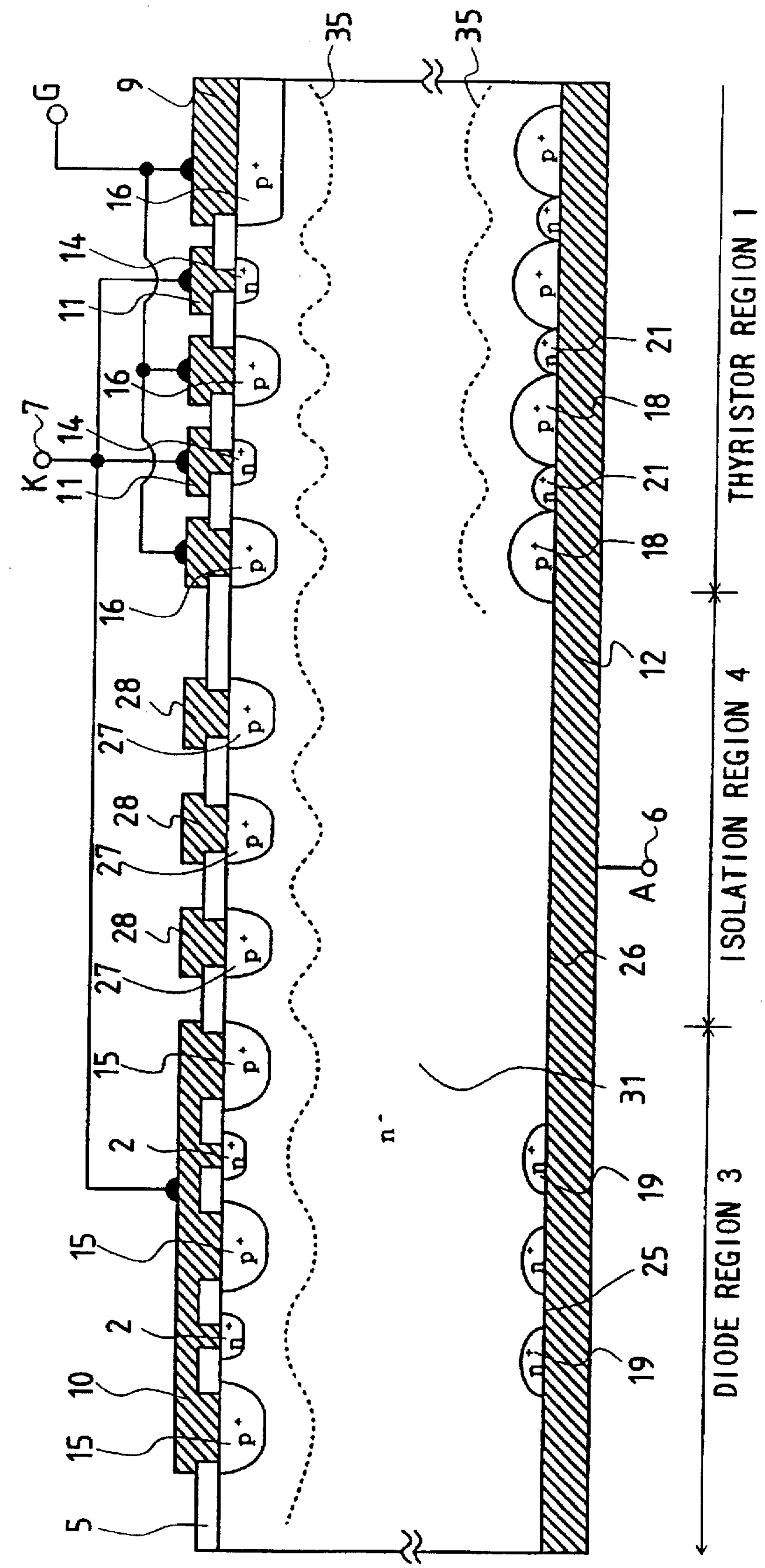
FIG. 3 is a sectional view schematically illustrating a RC thyristor with a planar-gate structure according to a third embodiment of the present invention.

FIG. 3 schematically illustrates, in section, the RC thyristor of the planar-gate structure according to a third embodiment of the present invention. This embodiment is common to the first and second embodiments in the construction of the first main surface region of the high-resistivity semiconductor substrate 31. This embodiment features the configuration of the second main surface region of the substrate 31. That is, an SI anode-shorted structure is introduced into the anode side of the thyristor region 1 to thereby reduce the quantity of pull-out charges from the gate electrode at turn-OFF and hence improve the switching performance. Anode $n^+$ layers (SI anode shorted regions) 21 are shielded by a depletion layer that spreads in the semiconductor substrate 31 due to the contact potential difference of the PN junction between the p emitter layers 18 and the substrate 31. With this structure, electrons can effectively be absorbed by the anode electrode 12 through the anode $n^+$ layers 21 at the turn-OFF switching of the thyristor.

At the cathode side of the diode region 3, there are formed $n^+$ diode cathode regions (n emitter layers) 19 spaced a predetermined distance apart. Between the n emitter layers 19 there is formed a Schottky contact 25, whereas also in the isolation region 4 there is formed an isolation Schottky contact 26. The device structure of this embodiment permits simultaneous formation of the $n^+$ regions 19 and 21.

[Embodiment 4]

Figure 4:
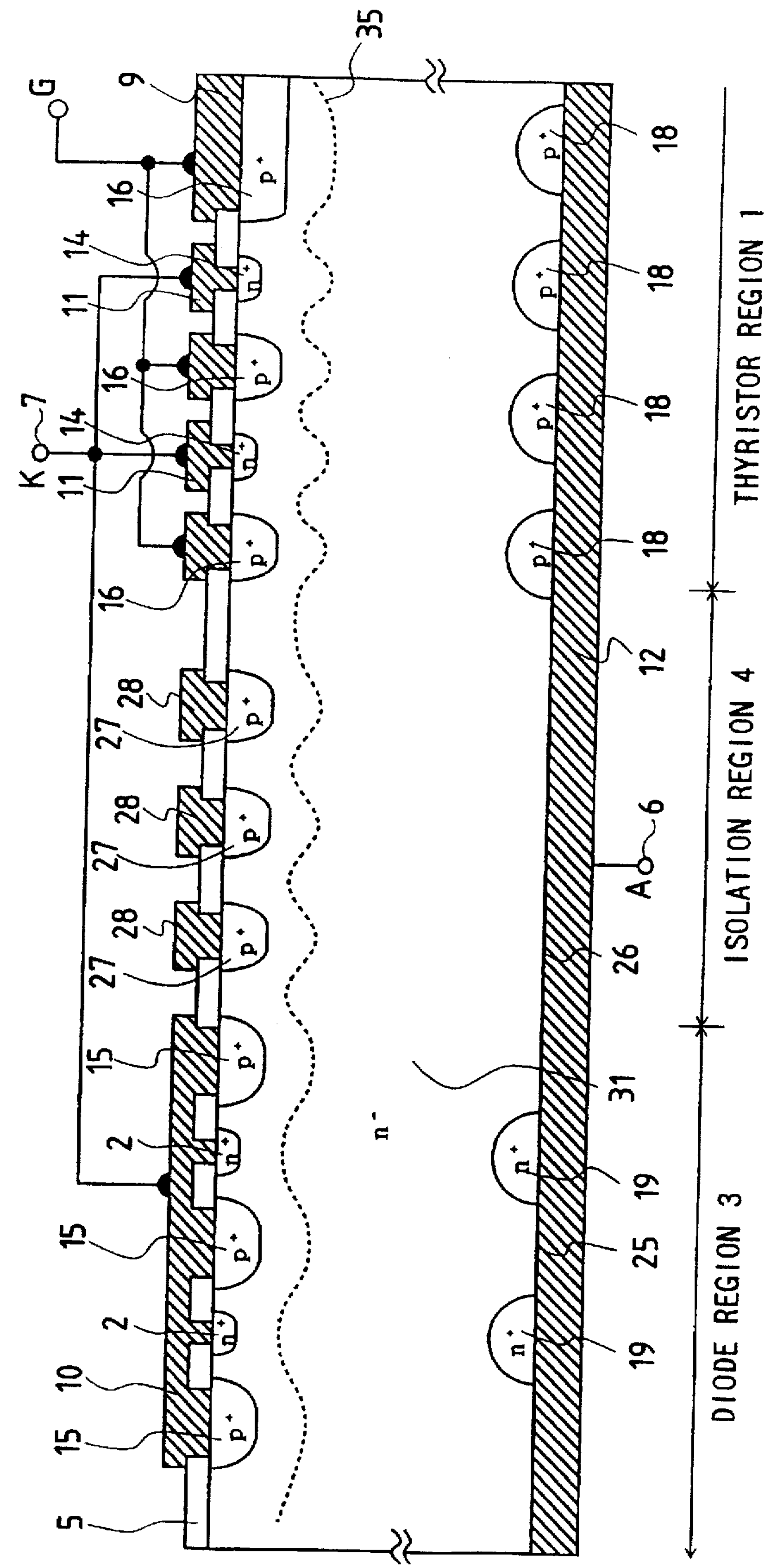
FIG. 4 is a sectional view schematically illustrating a RC thyristor with a planar-gate structure according to a fourth embodiment of the present invention.

FIG. 4 schematically illustrates, in section, the RC thyristor of the planar-gate structure according to a fourth embodiment of the present invention. This embodiment features the formation of wave-shaped p emitter layers 18 at the anode side of the thyristor region 1 and the formation of n emitter layers 19 with the Schottky contact 25 interposed therebetween.

[Embodiment 5]

Figure 5:
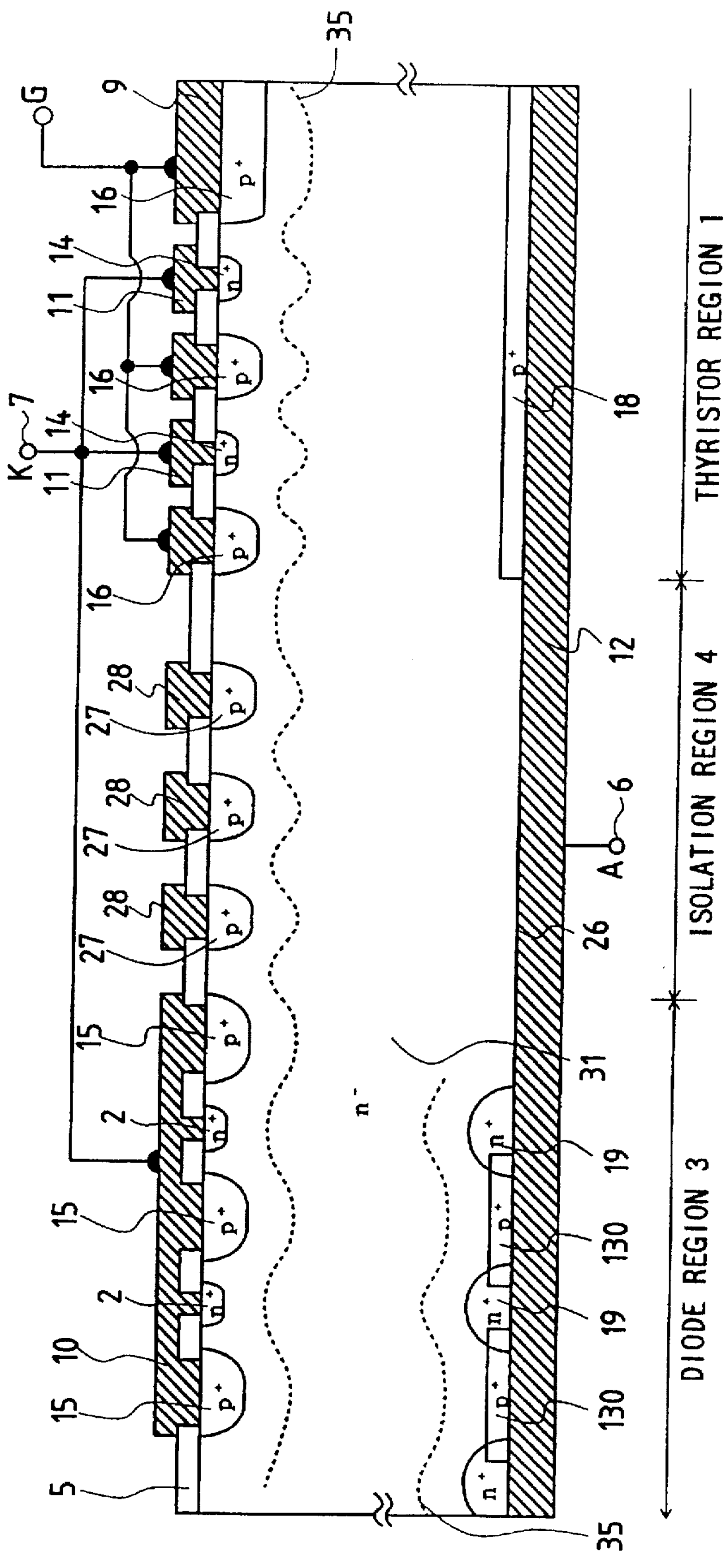
FIG. 5 is a sectional view schematically illustrating a RC thyristor with a planar-gate structure according to a fifth embodiment of the present invention.

FIG. 5 schematically illustrates, in section, the RC thyristor of the planar-gate structure according to a fifth embodiment of the present invention. In this embodiment, the anode side of the thyristor region 1 has a uniformly diffused p emitter layer 18 as in the case of the FIG. 1 embodiment, whereas the cathode side of the diode region 3 has enlarged diode cathode shorted regions 130 each formed between the n emitter layers 19. The enlarged anode cathode shorted regions 130 are to effectively absorb holes from the cathode side over a region wider than does the diode cathode shorted region 13 shown in FIG. 2. The shorted regions 130 are also shielded by the depletion layer spreading in the $n^-$ layer 31 owing to the contact potential difference of the PN junction between the $n^+$ layers 19 and the $n^-$ layer 31 as in the case of FIG. 2 embodiment. With the device construction of this embodiment, since the number of holes that are absorbed into the enlarged diode cathode shorted regions 130 is larger than in the FIG. 2 embodiment, the quantity of charges stored during the recovery period of the diode can be further reduced. The construction of this embodiment permits simultaneous formation of the $p^+$ regions 130 and 18.

[Embodiment 6]

Figure 6:
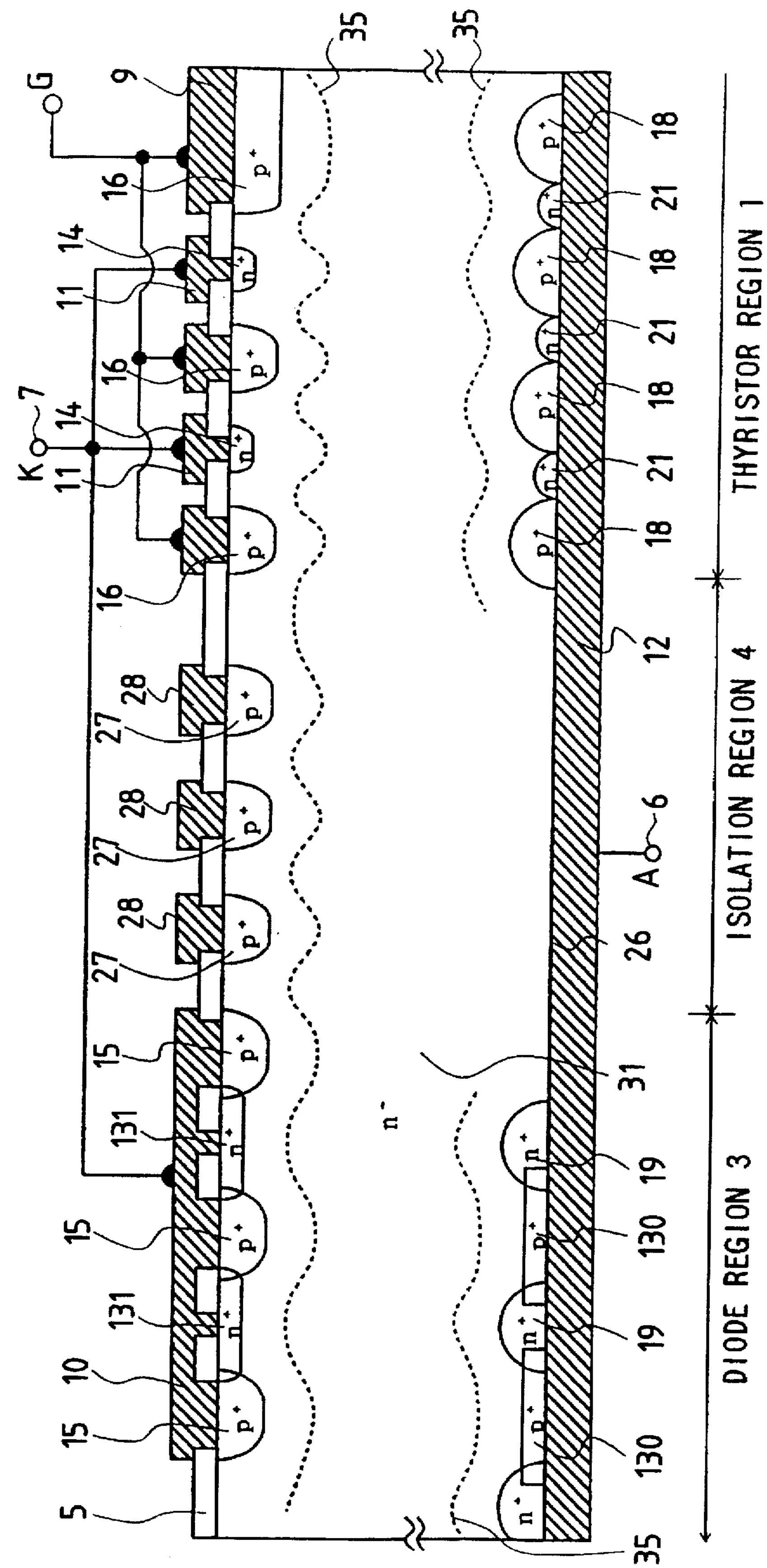
FIG. 6 s a sectional view schematically illustrating a RC thyristor with a planar-gate structure according to a sixth embodiment of the present invention.

FIG. 6 schematically illustrates, in section, the RC thyristor of the planar-gate structure according to a sixth embodiment of the present invention. This embodiment is common to the FIG. 5 embodiment in the construction of the cathode side of the diode region 3 but is characterized in that the anode side of the thyristor region 1 employs the same SI anode shorted structure as described above in respect of the FIG. 3 embodiment.

[Embodiment 7]

Figure 7:
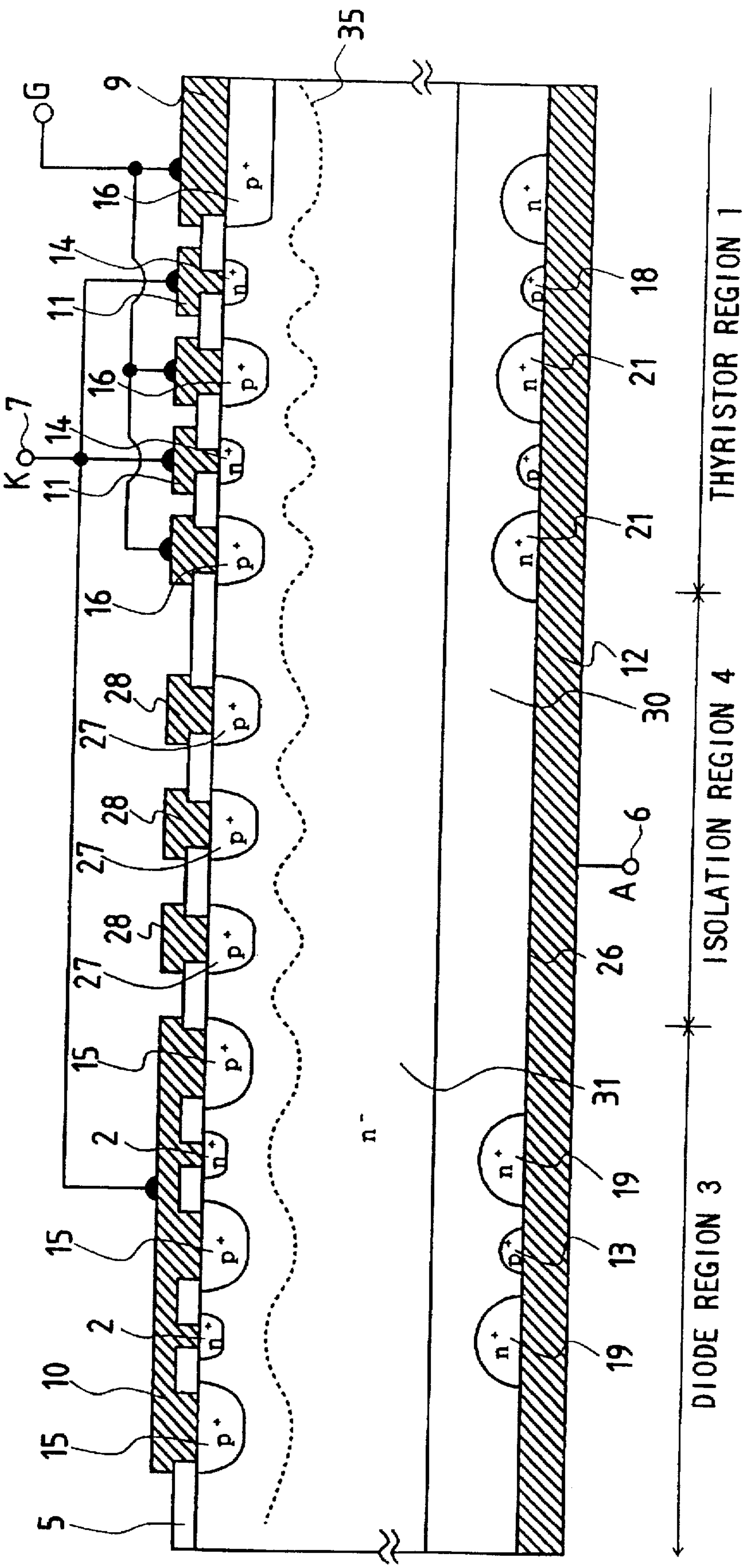
FIG. 7 is a sectional view schematically illustrating a RC thyristor with a planar-gate structure according to a seventh embodiment of the present invention.

FIG. 7 schematically illustrates, in section, the RC thyristor of the planar-gate structure according to a seventh embodiment of the present invention. In this embodiment, an n buffer layer 30 is formed by epitaxial growth or diffusion in the high-resistivity semiconductor substrate 31 at the anode side of the thyristor region 1, the cathode side of the diode region 3 and in the isolation region 4. The n buffer layer 30 implements a PIN structure in both of the thyristor and diode regions 1 and 3 and hence increases the breakdown voltage of the thyristor, which at the same time it reduces the thickness of the $n^-$ layer 31 and speeds up the thyristor operation. In the n buffer layer 30 there are formed the anode $n^+$ layers 21 and the p emitter layers (thyristor anode regions) 18 at the anode side of the thyristor region 1 and the n emitter layers (the diode cathode regions) 19 and the diode cathode shorted region 13 at the cathode side of the diode region 3. The function of the diode cathode shorted region 13 is to effectively absorb holes from the vicinity of the cathode of the diode region 3 into the diode cathode electrode 12 during the reverse recovery period of the diode as referred to previously with reference to the embodiments of FIGS. 2, 5 and 6.

The anode $n^+$ layer 21 of the thyristor region 1 are shorted to the buffer layer 30. When the shorting ratio of the anode $n^+$ layer 21 to the n buffer layer 30 increases, the thyristor will not latch up; hence, an appropriate shorting ratio of, for example, 30% or less, is needed. The diffusion depth of the p emitter layer (the thyristor anode region) 18 is shown to be smaller than the diffusion depth of the anode $n^+$ layer 21. By changing the depth of the p emitter layer 18, the effective base length of the n buffer layer 30 for holes changes. Hence, the efficiency of injection of holes into the $n^-$ layer 31 can be controlled by selecting the thickness of the n buffer layer 30 and the impurity concentration and diffusion depth of the p emitter layer 18. The impurity concentration of the n buffer layer 30 also affects the hole injection efficiency, and hence cannot be set too high; it is set in the range of, for example, $10^{15}$ to $10^{17}$ $cm^{-3}$. In this embodiment, the $n^+$ regions 19 and 21 can be formed simultaneously, and the $p^+$ regions 13 and 18 can also be formed at the same time.

[Embodiment 8]

Figure 8:
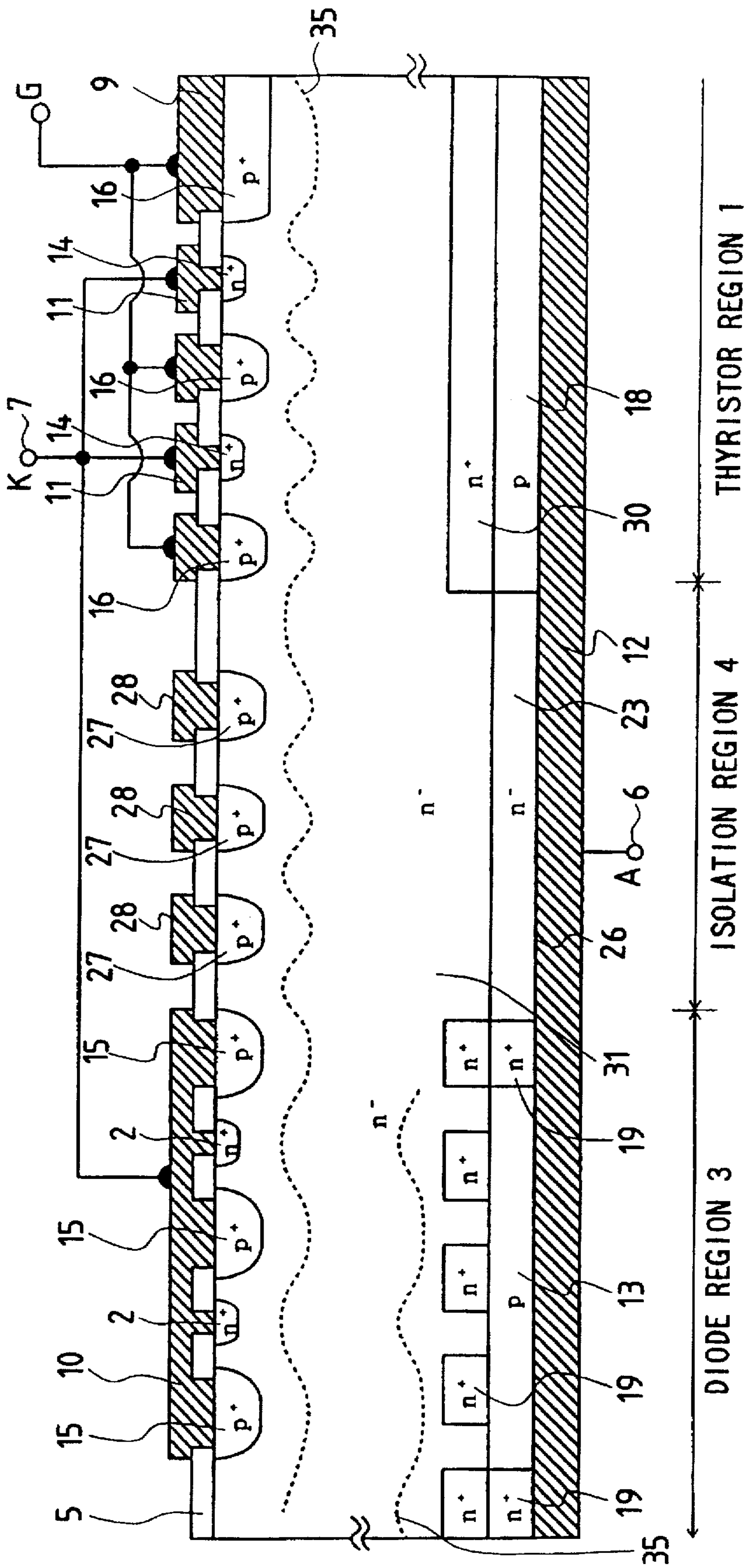
FIG. 8 is a sectional view schematically illustrating a RC thyristor with a planar-gate structure according to an eighth embodiment of the present invention.

FIG. 8 is a schematically illustrates, in section, the RC thyristor of the planar-gate structure according to an eighth embodiment of the present invention. In this embodiment either of the thyristor region 1 and the diode region 3 has the planar structure in the first main surface region of the high-resistivity semiconductor substrate 31 as in Embodiments 1 through 7, but the cathode side of the diode region 3 has a buried-gate structure. In this instance, n emitter layers (diode cathode regions) 19 are formed, as buried layers, simultaneously with the n buffer later 30 and are shorted to the diode cathode electrode 12 with a fixed shorting pitch. The formation of an epitaxial layer 23 is followed by the formation of the p emitter layer (the thyristor anode region) 18 and the diode cathode shorted region 13. In this embodiment the diode region 3 forms an SI diode which has the planar structure at the anode side and the buried structure at the cathode side, whereas the thyristor region 1 forms an SI thyristor having the n buffer layer 30. With the buried n emitter layers (the diode cathode region) 19, a high breakdown voltage can easily be obtained in the diode region 3. Further, since the diode cathode shorted region 13 can be formed large, holes can be absorbed into the diode cathode electrode 12 with higher efficiency.

[Embodiment 9]

Figure 9:
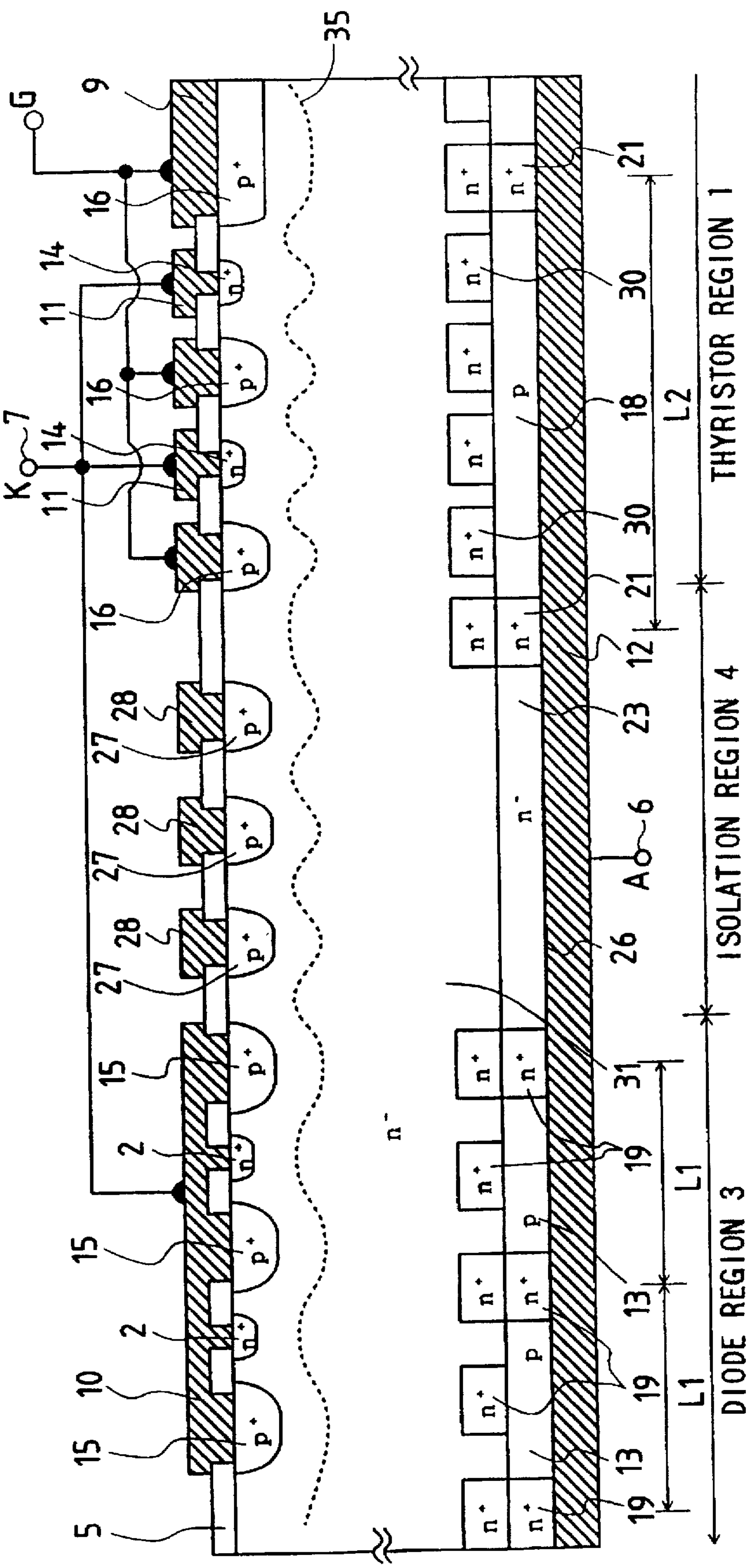
FIG. 9 is a sectional view schematically illustrating a RC thyristor with a planar-gate structure according to a ninth embodiment of the present invention.

FIG. 9 schematically illustrates, in section, the RC thyristor of the planar-gate structure according to a ninth embodiment of the present invention. This embodiment features the introduction of an SI buffer structure in the thyristor region 1. The SI buffer structure is already disclosed in Japanese Pat. Appln. No. 114140/92 entitled "Semiconductor Device with Static Induction Buffer Structure". In FIG. 9, the shorting pitch L2 of the anode $n^+$ layers 21 formed at the anode side of the thyristor region 1 is set to a value within twice the diffusion length Ln of electrons. The pitch with which n buffer layers 30 are formed as buried layers may be about the same as the pitch of the thyristor gate regions 16. Similarly, the pitch of the n emitter layers (diode cathode regions) 19 may be about the same as the pitch of the diode anode regions 15. The shorting pitch L1 of the diode cathode regions 19 to the diode cathode electrode 12 can be set to a value sufficiently smaller than twice the diffusion length Ln of electrons. The reason for this is that a contact is formed with each of the diode cathode regions 19 and that a latch-up by the thyristor structure needs to be prevented.

[Embodiments 10–13]

Figure 10:
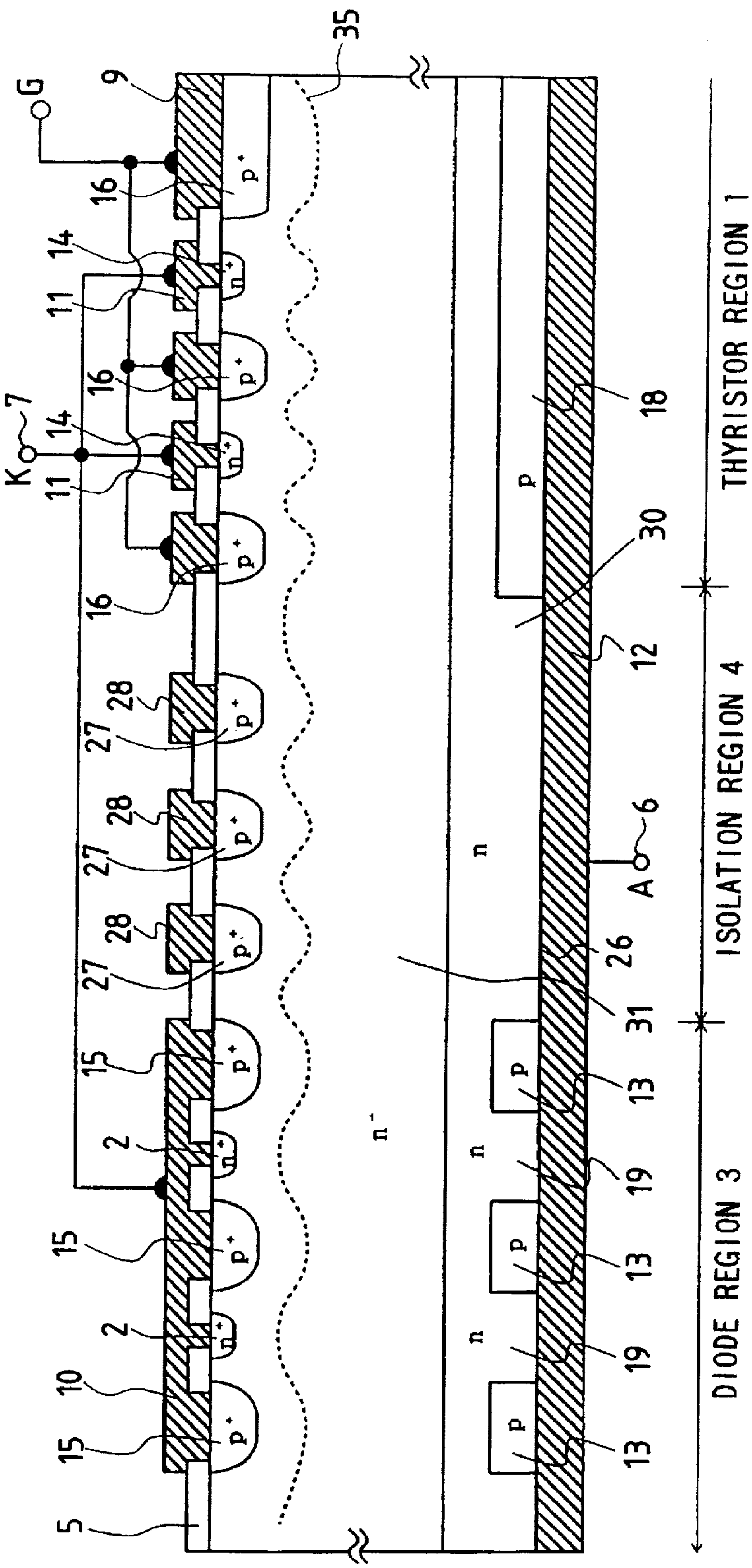
FIG. 10 is a sectional view schematically illustrating a RC thyristor with a planar-gate structure according to a tenth embodiment of the present invention.

FIG. 10 through schematically illustrates, in section, RC thyristors of the planar-gate structure according to tenth to thirteenth embodiments of the present invention, all of which have the n buffer layer 30 and are modified forms of the FIG. 7 embodiment. In the FIG. 10 embodiment the n buffer layer 30 is formed in common to the thyristor region 1, the diode region 3 and the isolation region 4; the thyristor region 1 and the diode region 3 have the p emitter layer (the thyristor anode region) 18 and the diode cathode shorted regions 13 respectively formed in the n buffer layer 30 by diffusion thereinto. Further, the n buffer layer 30 serves as regions common to the diode cathode regions 19 of the diode region 3.

Figure 11:
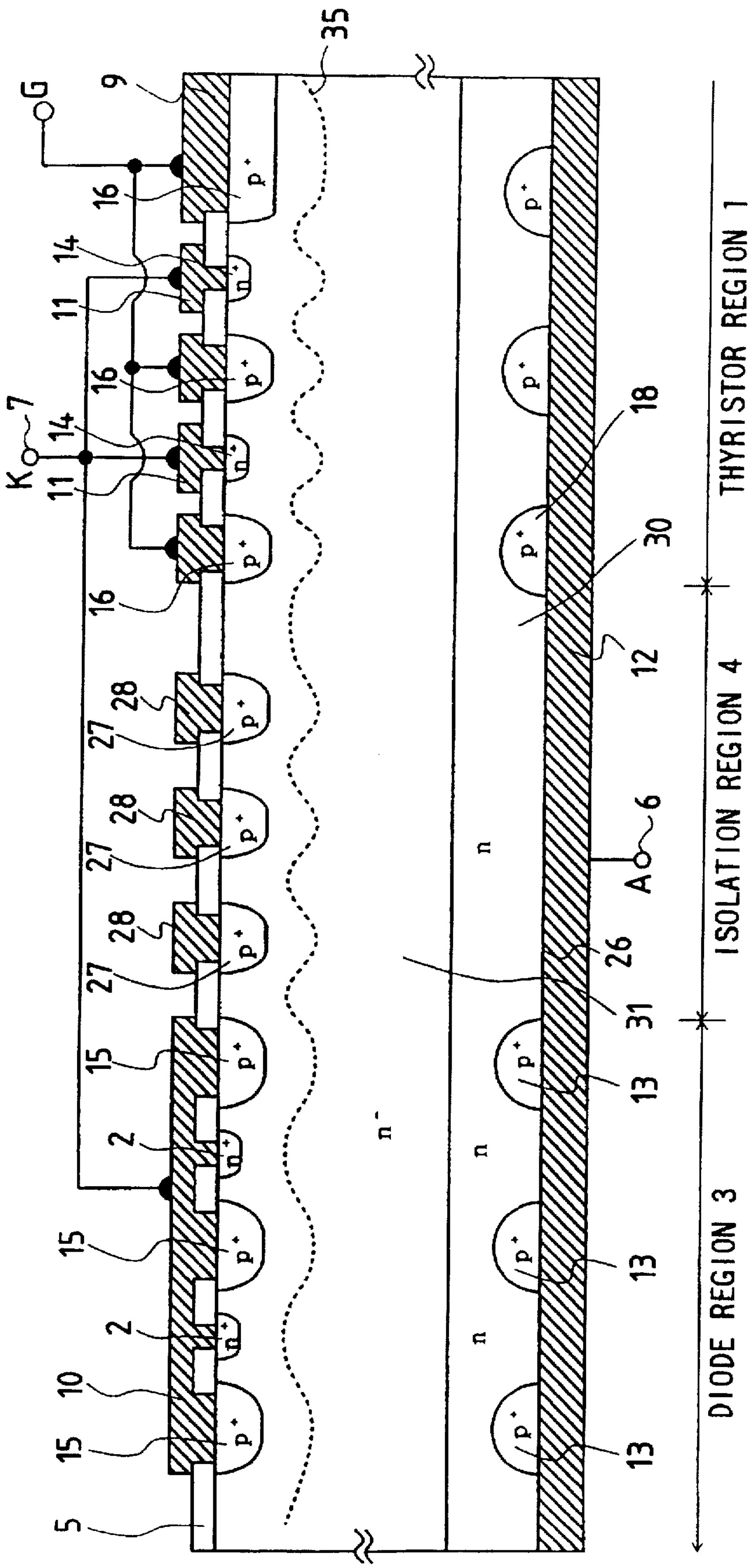
FIG. 11 is a sectional view schematically illustrating a RC thyristor with a planar-gate structure according to an eleventh embodiment of the present invention.
Figure 12:
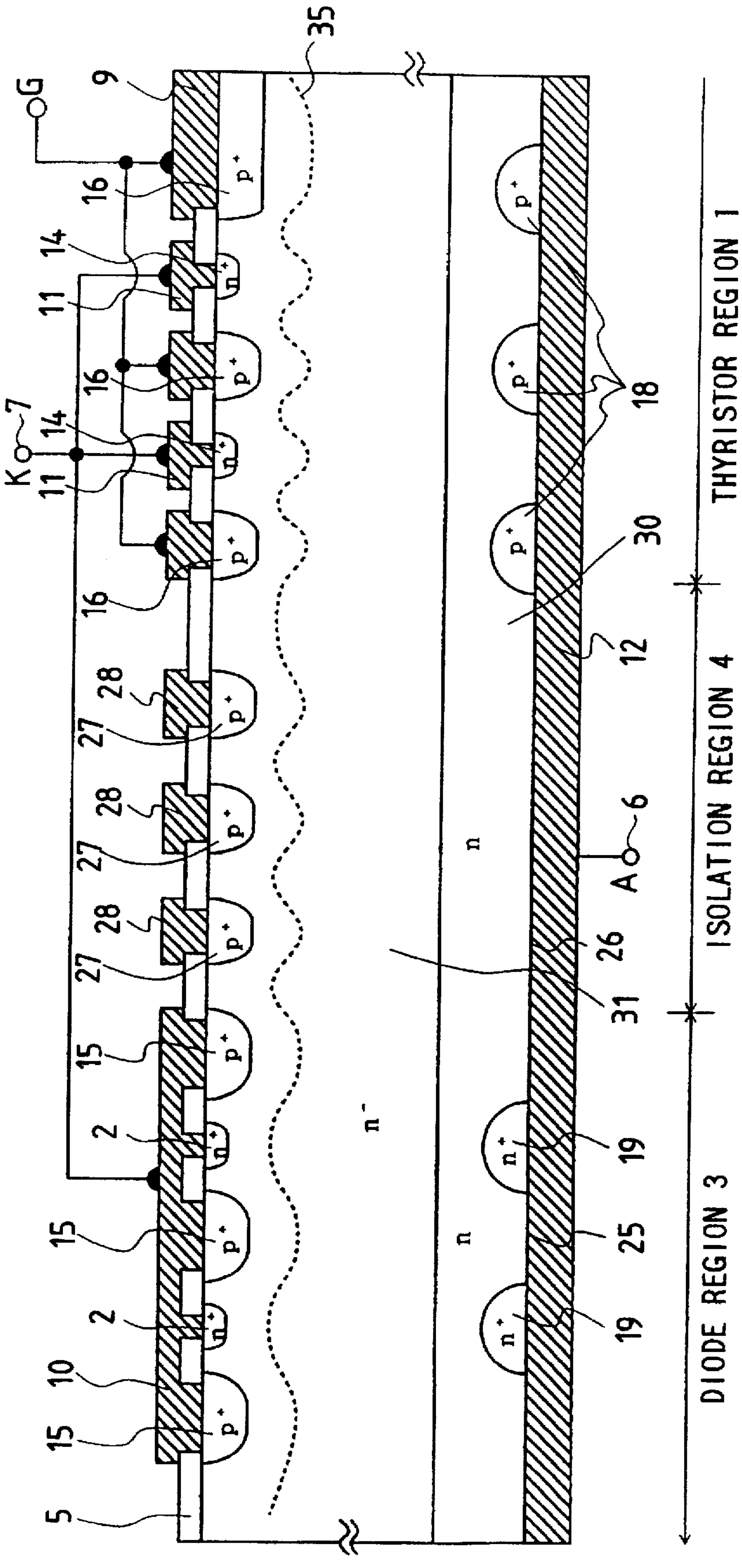
FIG. 12 is a sectional view schematically illustrating a RC thyristor with a planar-gate structure according to a twelfth embodiment of the present invention.
Figure 13:
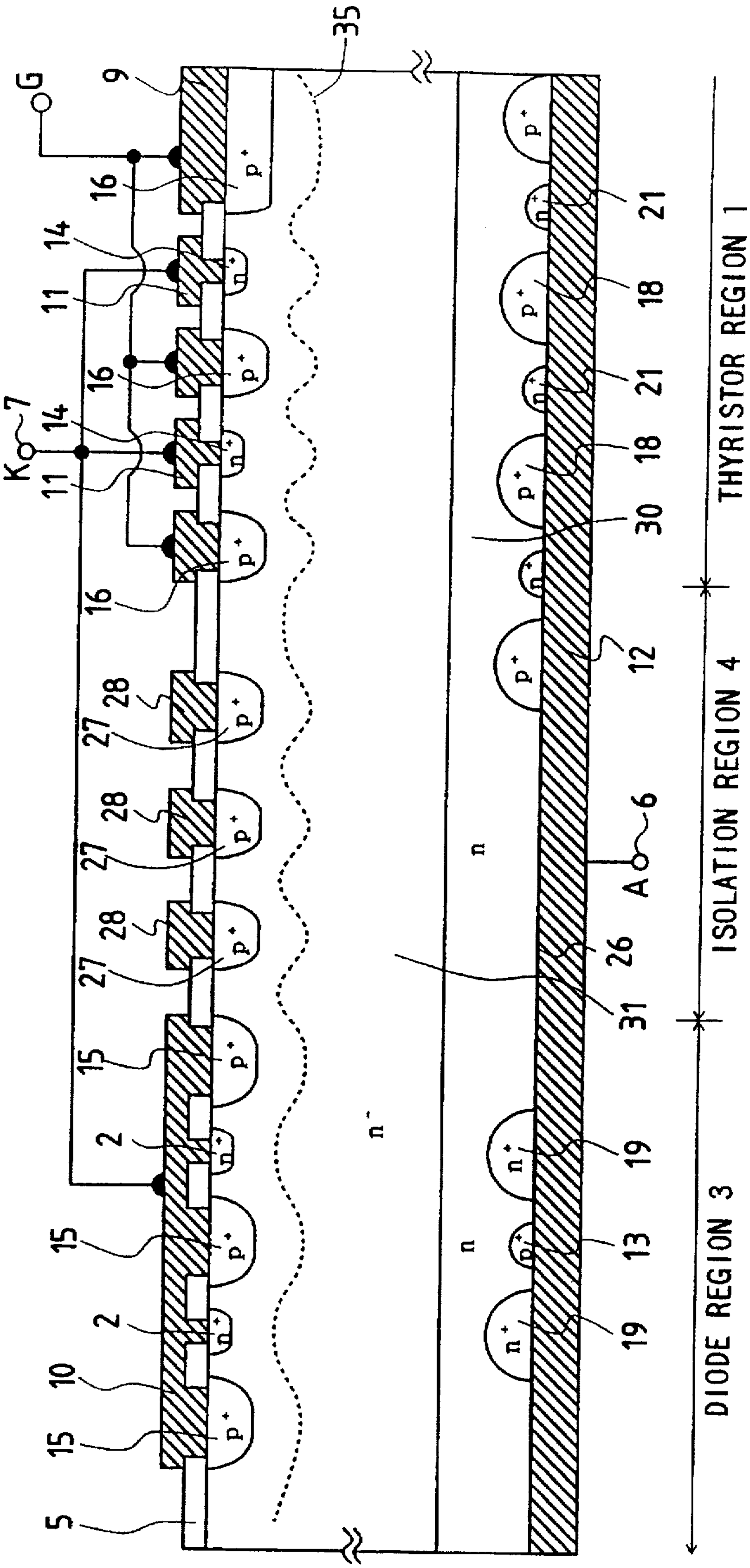
FIG. 13 is a sectional view schematically illustrating a RC thyristor with a planar-gate structure according to a thirteenth embodiment of the present invention.

In the embodiment of FIG. 11, there are formed wave-shaped p emitter layers (thyristor anode regions) 18 in the thyristor region 1. According to the embodiment of FIG. 12, the wave-shaped p emitter layers (thyristor anode region) 18 are formed in the thyristor region 1, but in the diode region 3 n emitter layers (diode cathode regions) 19 are spaced a predetermined distance apart, between which a Schottky contact is formed. In the FIG. 13 embodiment, the thyristor region 1 and the diode region 3 have anode $n^+$ layers 21 and the diode cathode shorted region 13, respectively, formed in the n buffer layer 30 in addition to the layers 18 and 19. With this construction, at the anode side of the thyristor region 1 electrons in the n buffer layer 30 can effectively be absorbed into the thyristor anode electrode 12 through the anode $n^+$ layers 21, whereas at the cathode side of the diode region 3 holes can effectively be absorbed into the diode cathode electrode.

In any of the constructions shown in FIGS. 10 to 13, the thickness of the $n^-$ layer 31 can be reduced in the diode region 3 and the thyristor region 1 by the formation of the n buffer layer 30 common thereto and the PIN-structured thyristor and diode regions 1 and 3 allow ease in obtaining a high breakdown voltage. Further, the diode and thyristor regions 1 and 3 are both capable of high-speed switching.

[Embodiment 14]

Figure 14:
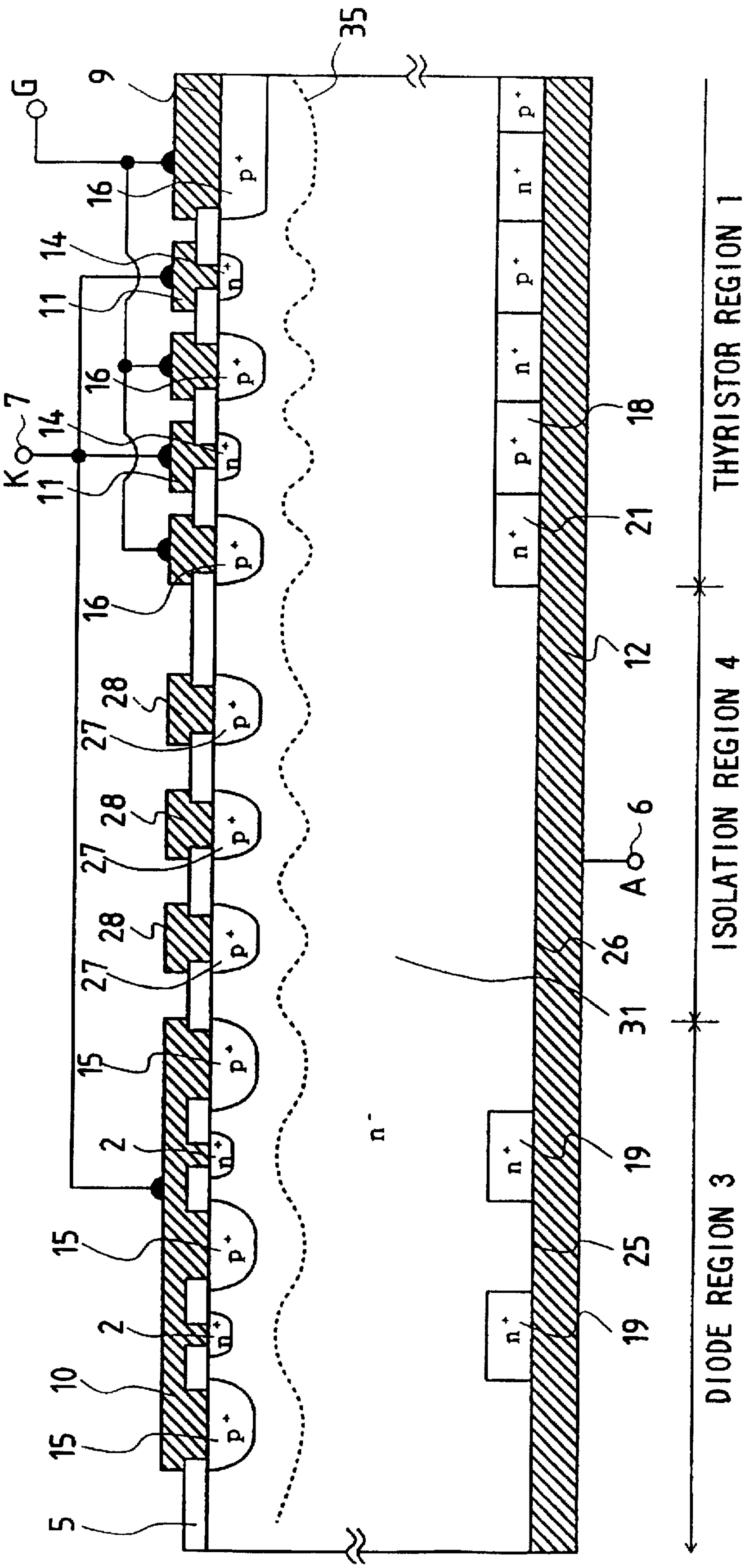
FIG. 14 is a sectional view schematically illustrating a RC thyristor with a planar-gate structure according to a fourteenth embodiment of the present invention.

FIG. 14 schematically illustrates, in section, the RC thyristor of the planar-gate structure according to a fourteenth embodiment of the present invention. In this embodiment, the thyristor region 1 employs a conventional anode shorted structure containing the anode $n^+$ layers 21 and the p emitter layers 18 and the diode region 3 has diode cathode regions 19 spaced a predetermined distance apart. The $n^+$ layers 19 and 21 can be formed simultaneously.

[Embodiment 15]

Figure 15:
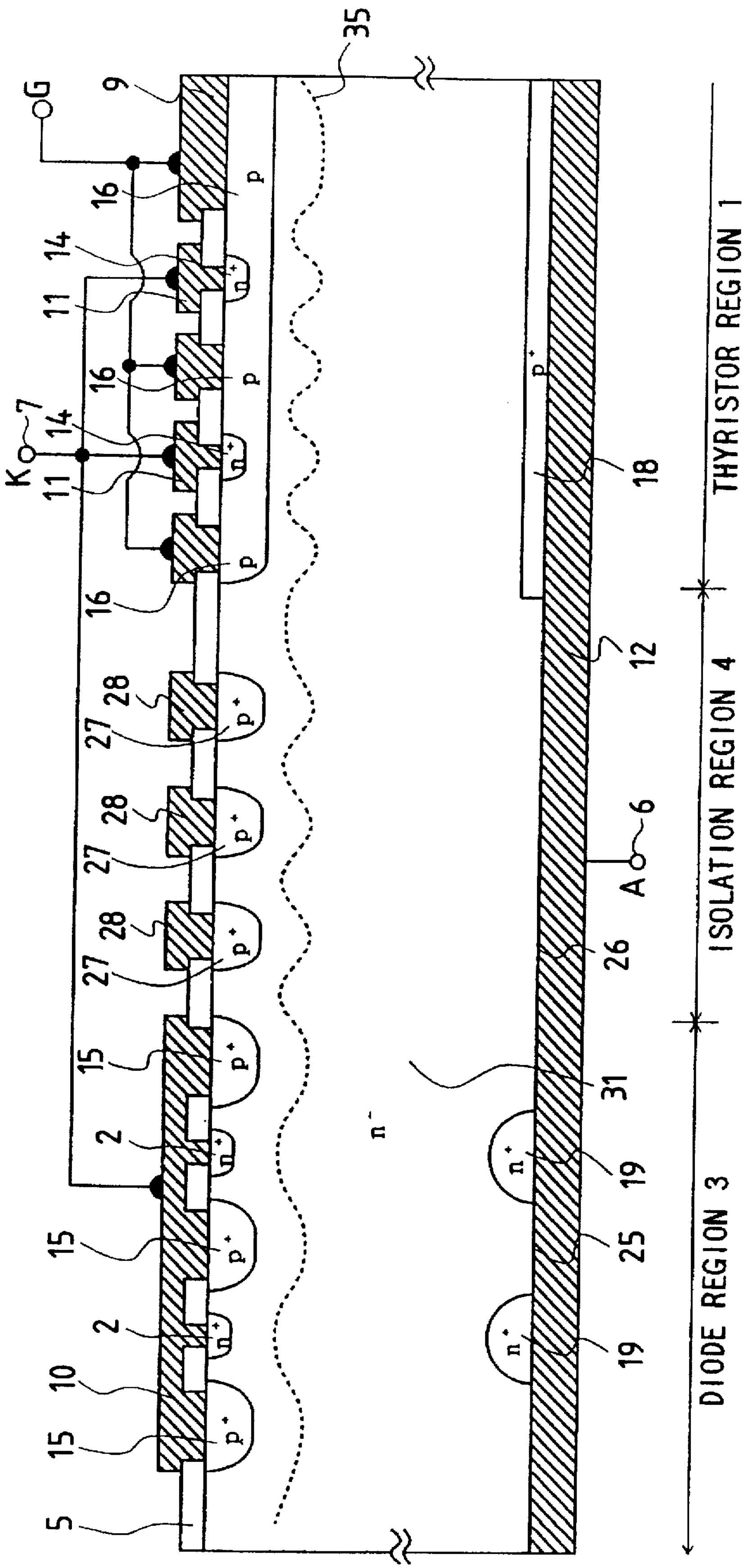
FIG. 15 is a sectional view schematically illustrating a RC thyristor with a planar-gate structure according to a fifteenth embodiment of the present invention.

FIG. 15 schematically illustrates, in section, the RC thyristor of the planar-gate structure according to the present invention. In this embodiment, the thyristor region 1 has a GTO of a miniaturized planar-gate structure and the diode region 3 an SI diode of the planar structure. The anode side of the thyristor region 1 and the cathode side of the diode region 3 are identical in construction with those in the FIG. 1 embodiment. It is a matter of course that the constructions of the anode side of the thyristor 1 and the cathode side of the diode region 3 used in Embodiments 2 to 14 can also be applied to this embodiment. The isolation region 4 also has the same construction as in Embodiment 1 but other simple constructions can be used.

The FIG. 15 embodiment features the formation of the miniaturized GTO as the thyristor region 1. By reducing the pitch of the contact regions between the gate electrode 9 and the p base layers 16 down to about the same value as the SI thyristor of the planar-gate structure, a high-speed GTO of a normally-OFF characteristic is formed. In this embodiment, the p base layers 16 of the thyristor region 1, the $p^+$ layers 27 of the isolation region 4 and the $p^+$ diode anode regions 15 of the diode region 3 differ in impurity density, but the $p^+$ layers 27 and the $p^+$ diode anode regions 15 may also be formed with about the same impurity density as that of the p base layers of the GTO. Hence, the $p^+$ layers 15 and 27 and the p base layers 16 can be formed simultaneously. Similarly, the $n^+$ diode anode shorted regions 2 and the $n^+$ cathode regions 14 of the GTO thyristor region 1 can also be formed simultaneously.

When the impurity density of the $p^+$ layers 15 is set low, it is necessary to maintain the normally-OFF characteristic at the anode side of the diode region 3; hence, the $p^+$ layers 15 need to be formed with reduced pitch. To hold the normally-OFF characteristic, it is also possible to form an effective p base layer on the front area of each $n^+$ diode anode region 2, for example, by injecting ions of boron (B) into the substrate surface region at the anode side of the diode region 3.

As regards the isolation region 4, since the GTO is formed in the thyristor region 1, the isolation resistance may be lower than in the case of a normally-ON type SI thyristor; therefore, even if the impurity density of the $p^+$ layers 27 is substantially the same as the impurity density of the p base layers 16 of the GTO, no problem will arise in the isolation characteristic.

It should be understood that Embodiment 1 to 15 described above are intended as band illustrative of the present invention and could be modified and expanded in various ways. While in the above the main thyristor region has been described to be formed as the SI thyristor of the planar-gate structure, it is also possible to employ, an IGBT, MOS-controlled thyristor or MOS-controlled SI thyristor of the planar structure.

The MOS-controlled thyristor or MOS-controlled SI thyristor of the planar structure is disclosed in Japanese Pat. Appln. No. 114139/92 (or corresponding U.S. Pat. No. 5,324,966); the device structure disclosed in the prior art literature can also be employed. When the MOS-controlled thyristor is used, the gate could be driven with ease, besides the operation of the SI diode connected to the main thyristor in antiparallel relation thereto would be promoted since the main thyristor is turned off by a built-in p-channel MOSFET as well.

[Embodiment 16]

Figure 16:
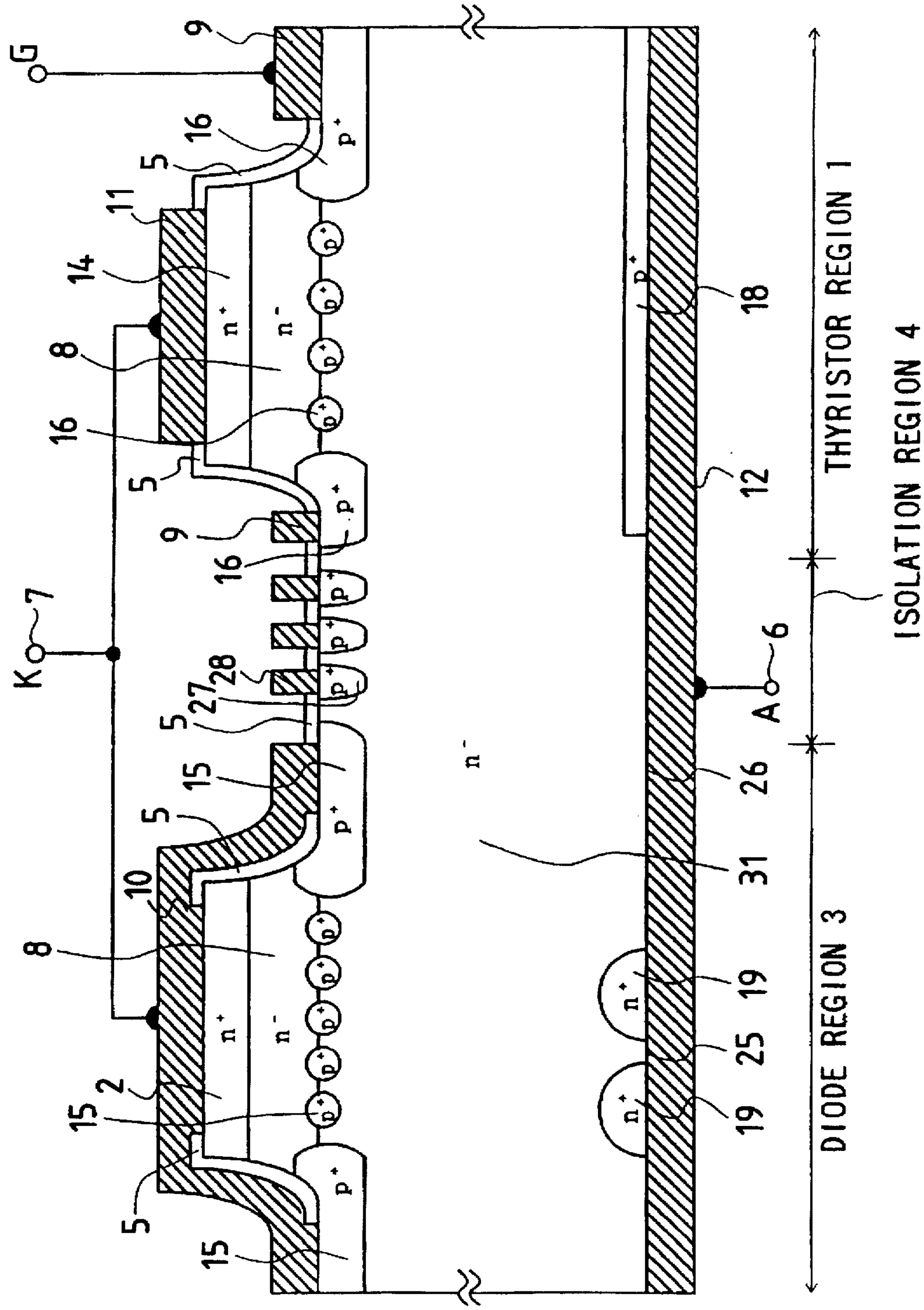
FIG. 16 is a sectional view schematically illustrating a RC thyristor with a buried-gate structure according to a sixteenth embodiment of the present invention.

FIG. 16 schematically illustrates, in section, the RC thyristor of the buried-gate structure according to a sixteenth embodiment of the present invention. In this embodiment the thyristor region is formed as an SI thyristor of the buried-gate structure and the diode region as an SI diode of the buried structure.

FIG. 16, reference numerals 1, 3 and 4 denote the thyristor region, the diode region and an isolation region all formed in a high-resistivity semiconductor substrate 31, respectively. In a first main surface of the high-resistivity semiconductor substrate (an n base layer) 31, there are formed p base (gate) layers 16 and an n emitter (cathode) layer 14 of the thyristor region 1, p emitter (anode) layers 15 and a diode anode shorted region 2 of the diode region $p^+$ layers 27 of the isolation region 4. In a second main surface of the high-resistivity semiconductor substrate 31 there are formed a p emitter (anode) layer 18 and n emitter (cathode) layers 19 of the diode region 3. In the isolation region 4 there is formed an isolation Schottky contact 26. In this embodiment there is formed a Schottky contact 26 between the n emitter layers 19 of the diode region 3. The function of the Schottky contact 25 is to suppress the injection of electrons from the diode cathode and facilitate the absorption of holes by a diode cathode electrode 12 (a global anode electrode) which are injected from the diode anode region (p emitter layer 15). The isolation Schottky contact 26 is to suppress latch-up in the isolation region 4 and prevent an extra injection of electrons into the diode region 3.

In the RC thyristor, a diode anode electrode 10 is held equipotential with a thyristor cathode electrode 11 via a global cathode electrode 7, and the diode cathode electrode is held equipotential with the thyristor anode electrode 12 via a global anode electrode 6. Further, the diode anode shorted region 2, which is characteristic of the RC thyristor according to the present invention, is shorted to the diode anode region 15 via the diode anode electrode 10. With the effect of shorting by diode anode shorted region 2, electrons which are distributed near the anode region 15 of the diode region 3 can be absorbed into the diode anode electrode 10 through the diode anode shorted region 2. Electrons in an $n^-$ layers (31 and 8) near the $n^+$ diode anode shorted region 2, surrounded by a depletion layer spreading from the diode anode region 15 into the high-resistivity layer ($n^-$) 31, are surrounded by a potential barrier during the reverse recovery of the diode; hence, the electrons are not injected into the diode cathode side but are rather absorbed by the diode anode electrode 10. This reduces the quantity of charges that are stored during the reverse recovery period and improves the reverse recovery performance of the diode, providing a high-speed switching characteristic. When a high-speed thyristor such as an SI thyristor is used as the main thyristor, it is desirable to use a diode which is small in the quantity of charges stored during the reverse recovery period, small in heating value and can be turned off at high speed.

The FIG. 16 embodiment employs an SI diode of the buried structure in the diode region 3 and an SI thyristor of the buried-gate structure in the main thyristor region 1, and hence can be manufactured with much ease. What is more important resides in that the SI diode can be expected to have switching performance substantially comparable to that of the SI thyristor which is dependent on the RC time constant between its gate and cathode at the input side, since the diode region 3 can be formed with a pattern pitch reduced down to about the same extent as that usable for the formation of the gate of the thyristor of the buried-gate structure. In terms of the operation of the SI diode the absorption of electrons from the $n^+$ diode anode region 2 significantly affects the reverse recovery characteristic of the SI diode as referred to previously; yet the SI diode manufactured with the same pitch as that of the SI thyristor can be expected to produce the same SI effect as that by the SI thyristor. This is associated with the rate at which the depletion layer spreads into the high-resistivity layer 31 from the diode anode region 15, and during the reverse recovery period of the diode it is desirable that the $n^+$ shorted region 2 be immediately shielded by the depletion layer which spreads into the $n^-$ layer (31) from the $p^+$ layer (15). The buried structure is excellent in this respect, too. To perform this, it is necessary that the anode region of the diode region an its vicinity be formed in the same manner as the region between the gate and cathode of the SI thyristor of the buried-gate structure.

In the FIG. 16 embodiment the thyristor region 1 has the p emitter layer 18 at the anode side. The suppression of a tail current at the turn-OFF of the thyristor is an important parameter for enhancement of the switching characteristic. Also in the RC-SI thyristor, the tail current needs to be suppressed; lifetime control by irradiation with an electron beam or the like is necessary in the FIG. 16 embodiment, too.

At the cathode side of the diode region 3 there are disposed the n emitter layers 19 in the form of stripes or islands with a view to suppressing the injection of electrons from the diode cathode side and increasing the hole absorption efficiency as mentioned previously.

In the isolation region 4 there are disposed in the first main surface of the substrate 31 the plurality of ring-shaped $p^+$ layers 27 surrounding the main thyristor region 1. The $p^+$ layers 27 are equally spaced apart. To maintain potential stability, metal electrodes 28 are each deposited on one of the $p^+$ layers 27.

Since the device structure of the FIG. 16 embodiment can be manufactured by a buried-gate process, the $p^+$ regions 15, 27 and 16 of the diode, isolation and thyristor regions 3, 4 and 1 can be simultaneously formed by selectively removing an insulating layer 5 as of $SiO_2$ through patterning to form windows and diffusing an impurity therethrough into the semiconductor substrate 31. In this case, ions of boron (B) may also be implanted. Similarly, the $n^+$ regions 2 and 14 of the diode and thyristor regions 3 and 1 can also be simultaneously formed in the n epitaxial layers 8 by diffusion or implantation of ions of phosphorus (P), arsenic (As) or the like. The isolation region 4 in shown to have three $p^+$ layers 27 but need not be limited specifically to the illustrated structure and may also be formed as a structure called a successively interconnected junction structure disclosed in, for example, Japanese Pat. Appln. No. 337823/94 entitled "Reverse Conducting Static Induction Thyristor" filed in the name of the assignee of this application. Other simple structures can be used for the isolation region as long as they have fabrication process compatibility with the main thyristor region 1 and the diode region 3.

It is a major characteristic of the FIG. 16 embodiment that the $p^+$ diode anode regions 15, then n epitaxial layer 8 and the $n^+$ diode anode region 2 of the SI diode region can be formed simultaneously with the gate regions 16, the n epitaxial layer 8 and the $n^+$ thyristor cathode region 14 of the SI thyristor of the buried-gate structure. The pattern pitch or channel width of the buried structure may be common to the thyristor region 1 and the diode region 3. Further, the pattern pitch or spacing of the $p^+$ layers 27 of the isolation region 4 may be the same as that of the buried structure of the thyristor region 1 or diode region 3.

When the SI thyristor region 1 has the normally-ON characteristic, however, the pattern pitch of the $p^+$ diode anode regions 15 of the buried structure needs to be set smaller than the pattern pitch of the $p^+$ buried-gate regions 16 of the thyristor region 3 since the SI diode region 3 is always required to have the normally-OFF characteristic. In this instance, it is necessary that channel regions defined between the $p^+$ layers 15 be interconnected by a depletion layer spreading from the diode anode regions 15 into the $n^-$ epitaxial layer 8 and the high-resistivity semiconductor substrate 31, forming an sufficient barrier against electrons in the $n^+$ diode anode shorted region 2.

The operation of the RC thyristor of the buried-gate structure is disclosed in the afore-mentioned Japanese Pat. Appln. No. 337823/94. The FIG. 16 embodiment has a construction wherein the SI thyristor of the buried-gate structure and the SI diode of the buried structure, connected thereto in antiparallel relation, are formed simultaneously. It is an important feature of this embodiment that the high breakdown voltage, high-speed SI diode of the buried structure, which well fits the high-speed operation of the SI thyristor and has fabrication process compatibility therewith as well.

[Embodiment 17]

Figure 17:
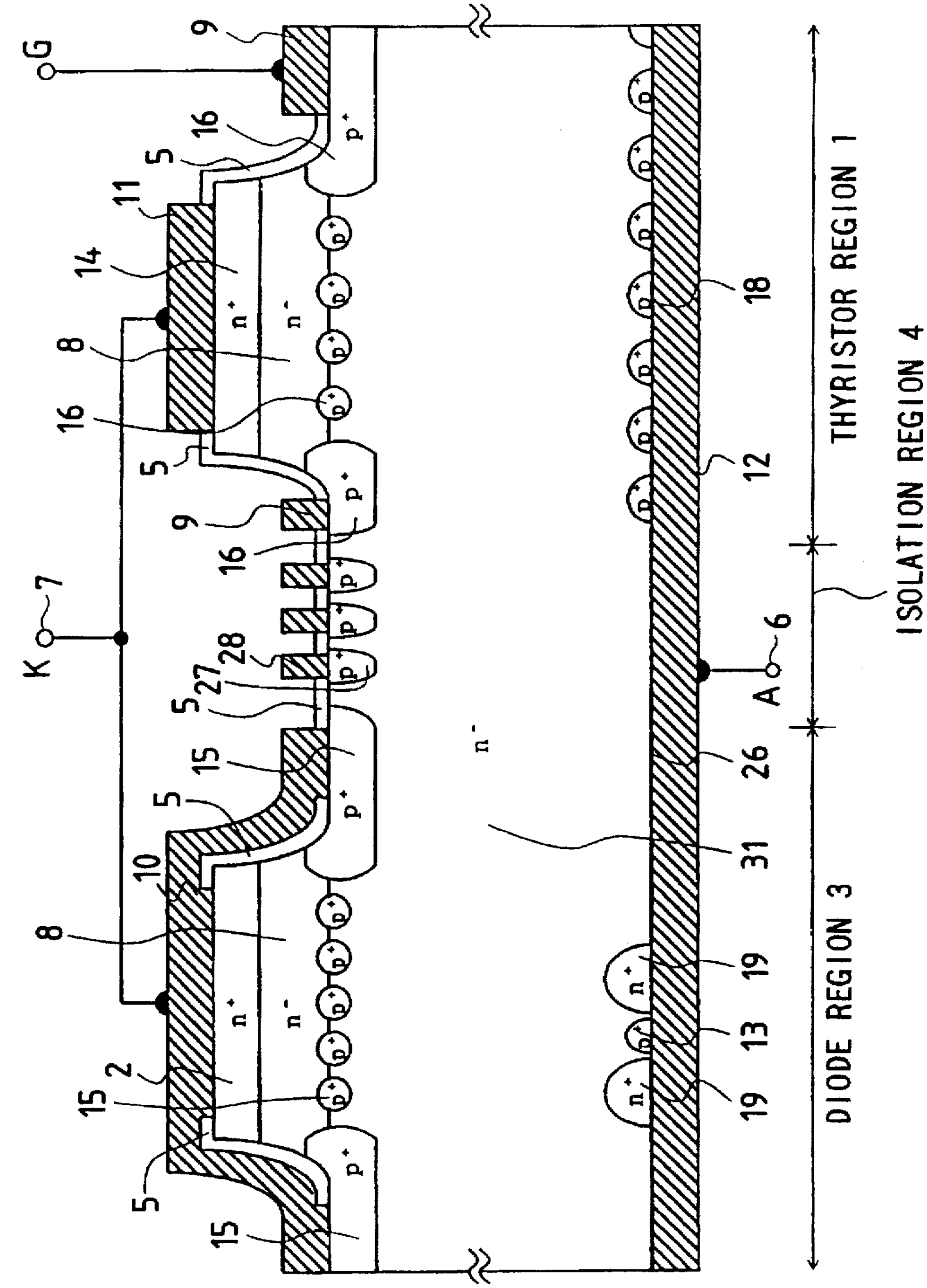
FIG. 17 is a sectional view schematically illustrating a RC thyristor with a buried-gate structure according to a seventeenth embodiment of the present invention.

FIG. 17 schematically illustrates, in section, the RC thyristor of the buried-gate structure according to a seventeenth embodiment of the present invention. This embodiment is common to the FIG. 16 embodiment in the construction of the first main surface region of the high-resistivity semiconductor substrate 31 but differs in the construction of the second main surface region (at the anode side) of the substrate 31. That is, at the anode side of the thyristor region 1, there are disposed wave-shaped $p^+$ emitter layers 18 with about the same pitch as or a little smaller than the pitch of the p base layers (gate layers) 16. The waves-shaped $p^+$ emitter layers 18 improve the efficiency of absorption of electrons by the thyristor anode electrode 12 from the $n^-$ layer surrounded by the $p^+$ emitter layers 18.

On the other hand, at the cathode side of the diode region 3 there is formed a $p^+$ diode cathode shorted region 13 between the n emitter layers 19 spaced a predetermined distance apart. The $p^+$ diode cathode shorted region 13 is a region for effectively absorbing holes from the vicinity of the cathode of the diode region 3 into the diode cathode electrode (the global anode electrode) 12 during the reverse recovery period of the diode. The $p^+$ diode cathode shorted region 13 is shielded by a depletion layer that spreads in the high-resistivity semiconductor substrate 31 by virtue of the contact potential difference of the PN junction between the n emitter layers 19 and the substrate 31. This embodiment has a construction that reduces the quantity of charges stored during the reverse recovery period of the diode by absorbing holes from the vicinity of the cathode of the diode region 3 through the $p^+$ diode cathode shorted region 13 and by absorbing electrons from the vicinity of the anode of the diode region 3 through the $n^+$ diode anode shorted regions 2. Charges that remain unabsorbed in the central part of the high-resistivity semiconductor substrate 31 can be reduced by a lifetime killer using lifetime control techniques. The device construction of this embodiment permits simultaneous formation of the $p^+$ regions 13 and 18.

[Embodiment 18]

Figure 18:
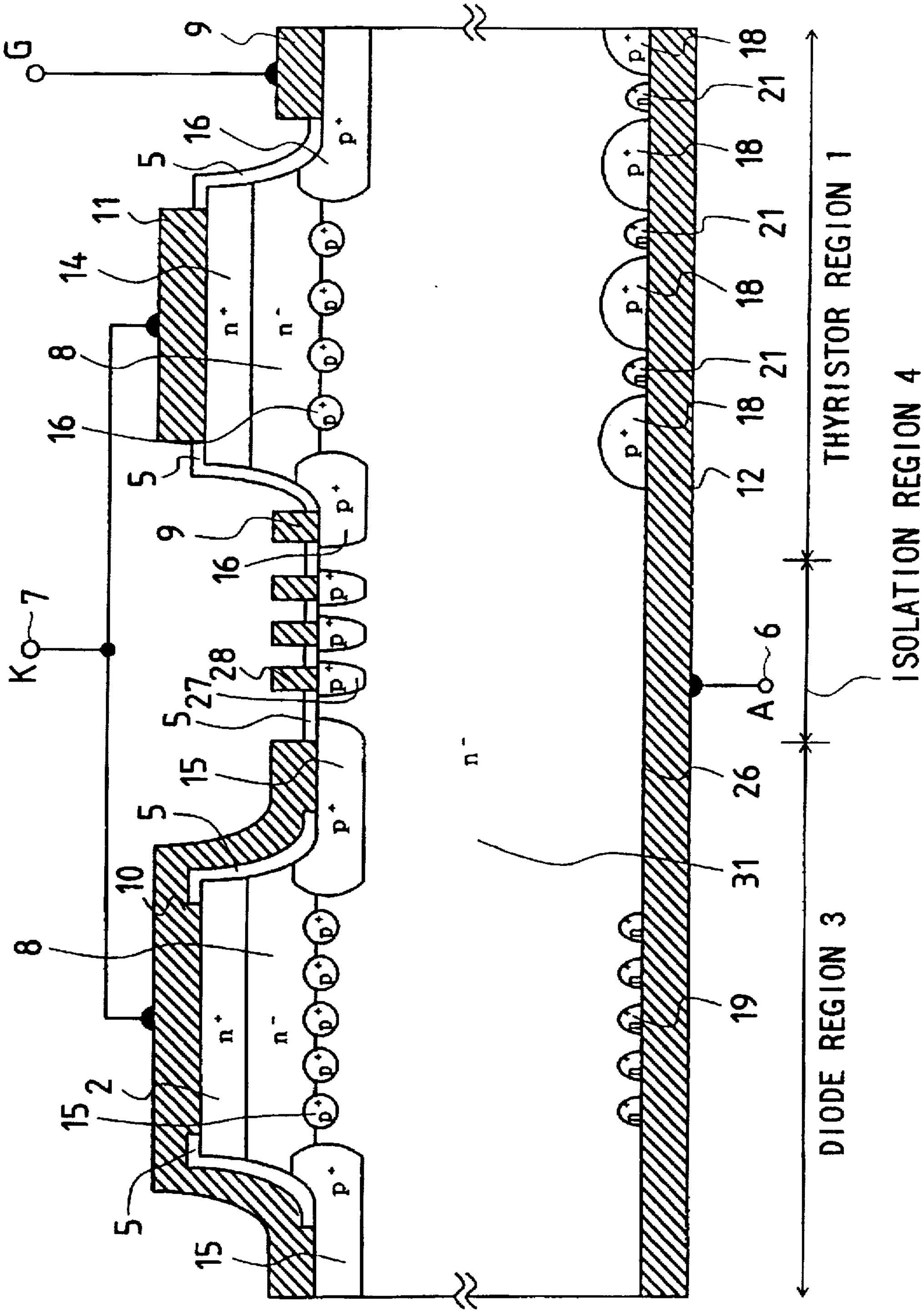
FIG. 18 is a sectional view schematically illustrating a RC thyristor with a buried-gate structure according to an eighteenth embodiment of the present invention.

FIG. 18 schematically illustrates, in section, the RC thyristor of the buried-gate structure according to an eighteenth embodiment of the present invention. This embodiment is common to the first and second embodiments in the construction of the first main surface region of the high-resistivity semiconductor substrate 31. This embodiment features the configuration of the second main surface region of the substrate 31. That is, the SI anode-shorted structure is introduced into the anode side of the thyristor region 1 to thereby reduce the quantity of pull-out charges from the gate electrode at turn-OFF and hence improve the switching performance. Anode $n^+$ layers (SI anode shorted regions) 21 are shielded by a depletion layer that spreads in the semiconductor substrate 31 due to the contact potential difference of the PN junction between the p emitter layers 18 and the substrate 31. With this structure, electrons can effectively be absorbed by the anode electrode 12 through the anode $n^+$ layers 21 at the turn-OFF switching of the thyristor.

At the cathode side of the diode region 3, there are formed $n^+$ diode cathode regions 19 spaced a predetermined distance apart. Between the n emitter layers 19 there is formed a Schottky contact 25, whereas also in the isolation region 4 there is formed an isolation Schottky contact 26. The device structure of this embodiment permits simultaneous formation of the $n^+$ regions 19 and 21.

[Embodiment 19]

Figure 19:
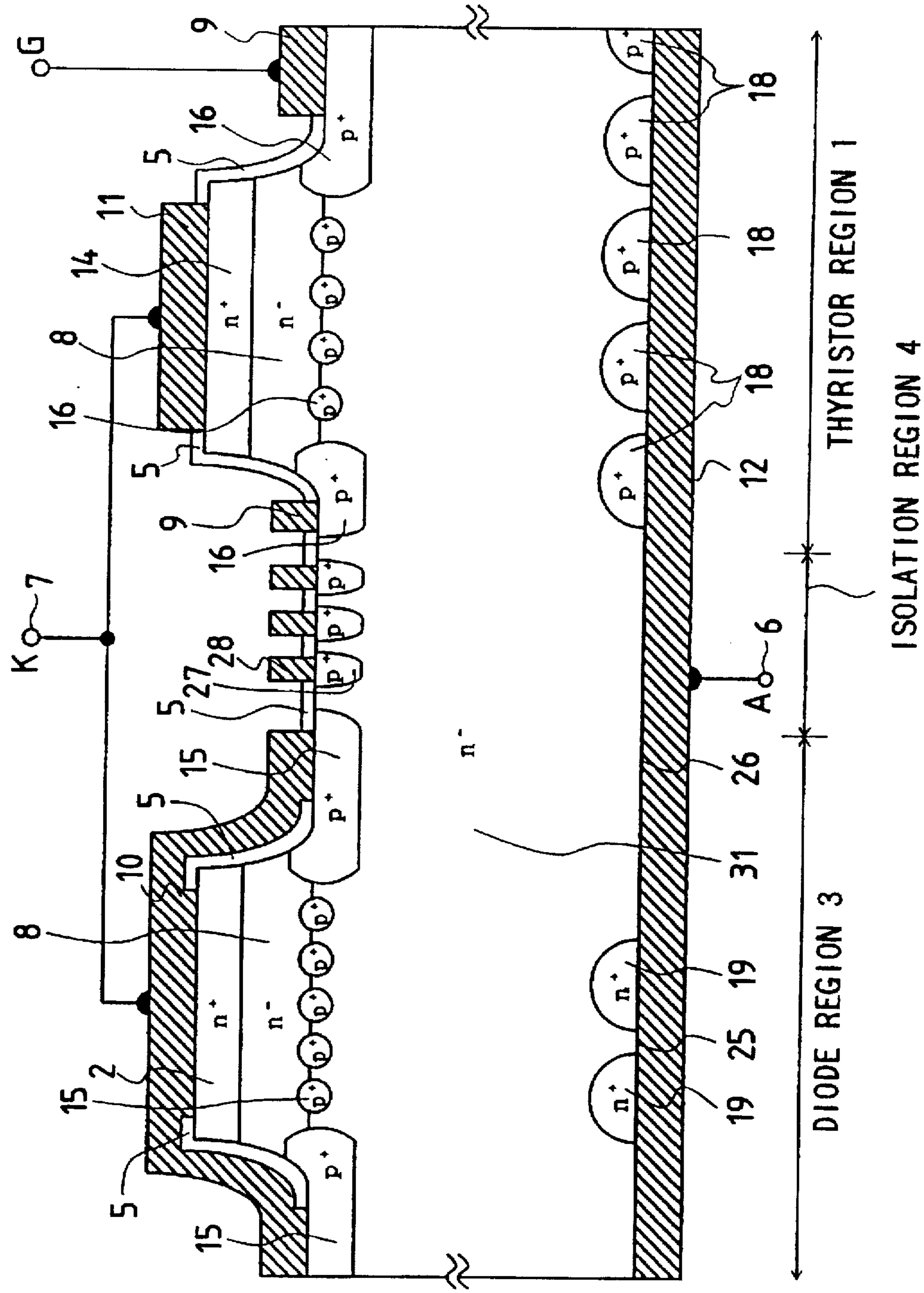
FIG. 19 is a sectional view schematically illustrating a RC thyristor with a buried-gate structure according to a nineteenth embodiment of the present invention.

FIG. 19 schematically illustrates, in section, the RC thyristor of the buried-gate structure according to a nineteenth embodiment of the present invention. This embodiment features the formation of wave-shaped p emitter layers 18 at the anode side of the thyristor region 1 and the formation of n emitter layers 19 with the Schottky contact 25 interposed therebetween.

[Embodiment 20]

Figure 20:
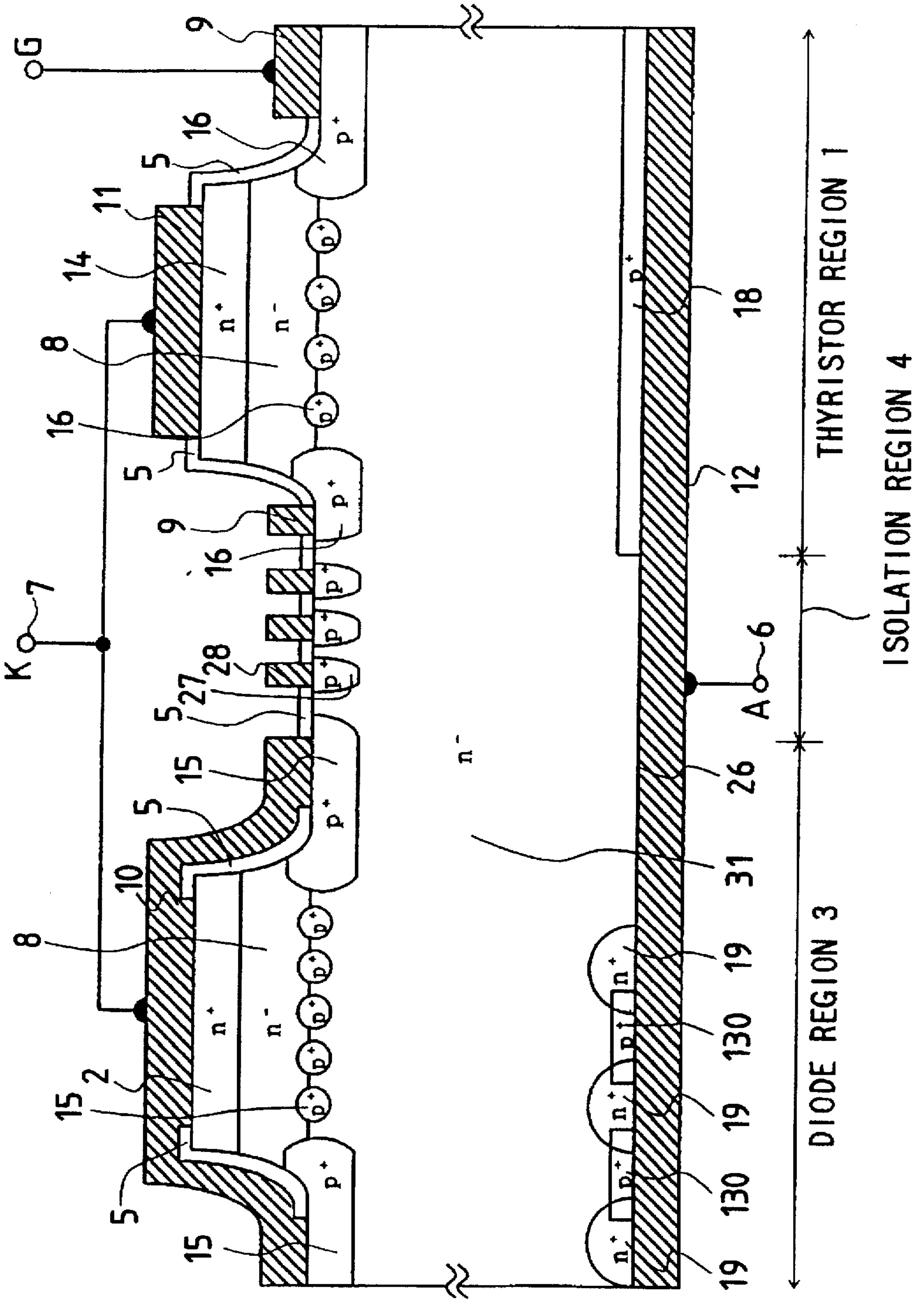
FIG. 20 is a sectional view schematically illustrating a RC thyristor with a buried-gate structure according to a twentieth embodiment of the present invention.

FIG. 20 schematically illustrates, in section, the RC thyristor of the buried-gate structure according to a twentieth embodiment of the present invention. In this embodiment, the anode side of the thyristor region 1 has a uniformly diffused p emitter layer 18 as in the case of the FIG. 16 embodiment, whereas the cathode side of the diode region 3 has enlarged diode cathode shorted regions 130 each formed between the n emitter layers 19. The enlarged anode cathode shorted regions 130 are to effectively absorb holes from the cathode side over a region wider than does the diode cathode shorted region 13 shown in FIG. 17. The shorted regions 130 are shielded by the depletion layer spreading in the $n^-$ layer 31 owing to the contact potential difference of the PN junction between the $n^+$ layers 19 and the $n^-$ layer 31 as in the case of FIG. 17 embodiment. With the device construction of this embodiment, since the number of holes that are absorbed into the enlarged diode cathode shorted regions 130 is larger than in the FIG. 17 embodiment, the quantity of charges shorted during the recovery period of the diode can be further reduced. The construction of this embodiment permits simultaneous formation of the $p^+$ regions 130 and 18.

[Embodiment 21]

Figure 21:
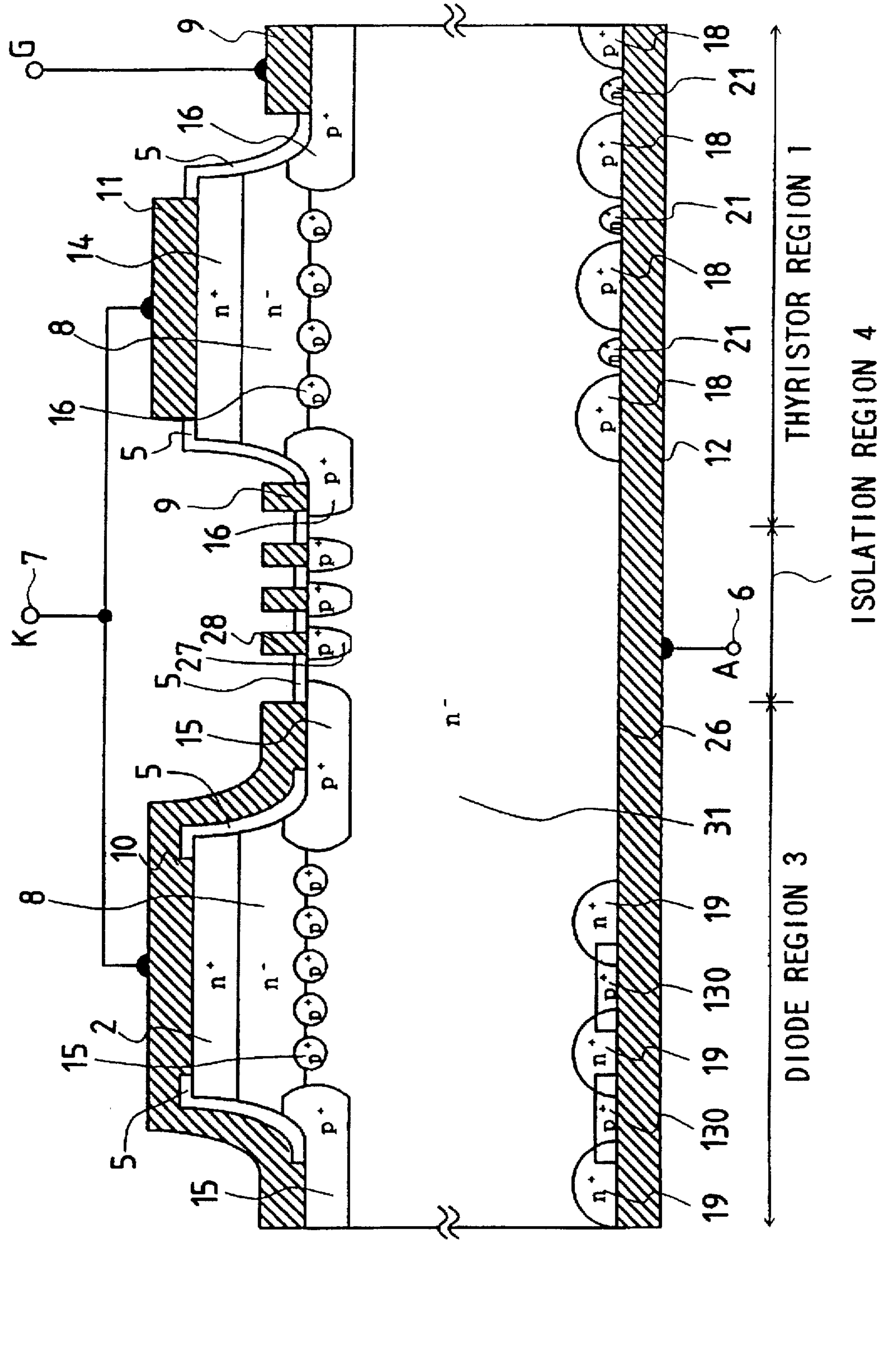
FIG. 21 is a sectional view schematically illustrating a RC thyristor with a buried-gate structure according to a twenty-first embodiment of the present invention.

FIG. 21 schematically illustrates, in section, the RC thyristor of the buried-gate structure according to a twenty-first embodiment of the present invention. This embodiment is common to the FIG. 20 embodiment in the construction of the cathode side of the diode region 3 but is characterized that the anode side of the thyristor region 1 employs the same SI anode shorted structure as described above in respect of the FIG. 18 embodiment.

[Embodiment 22]

Figure 22:
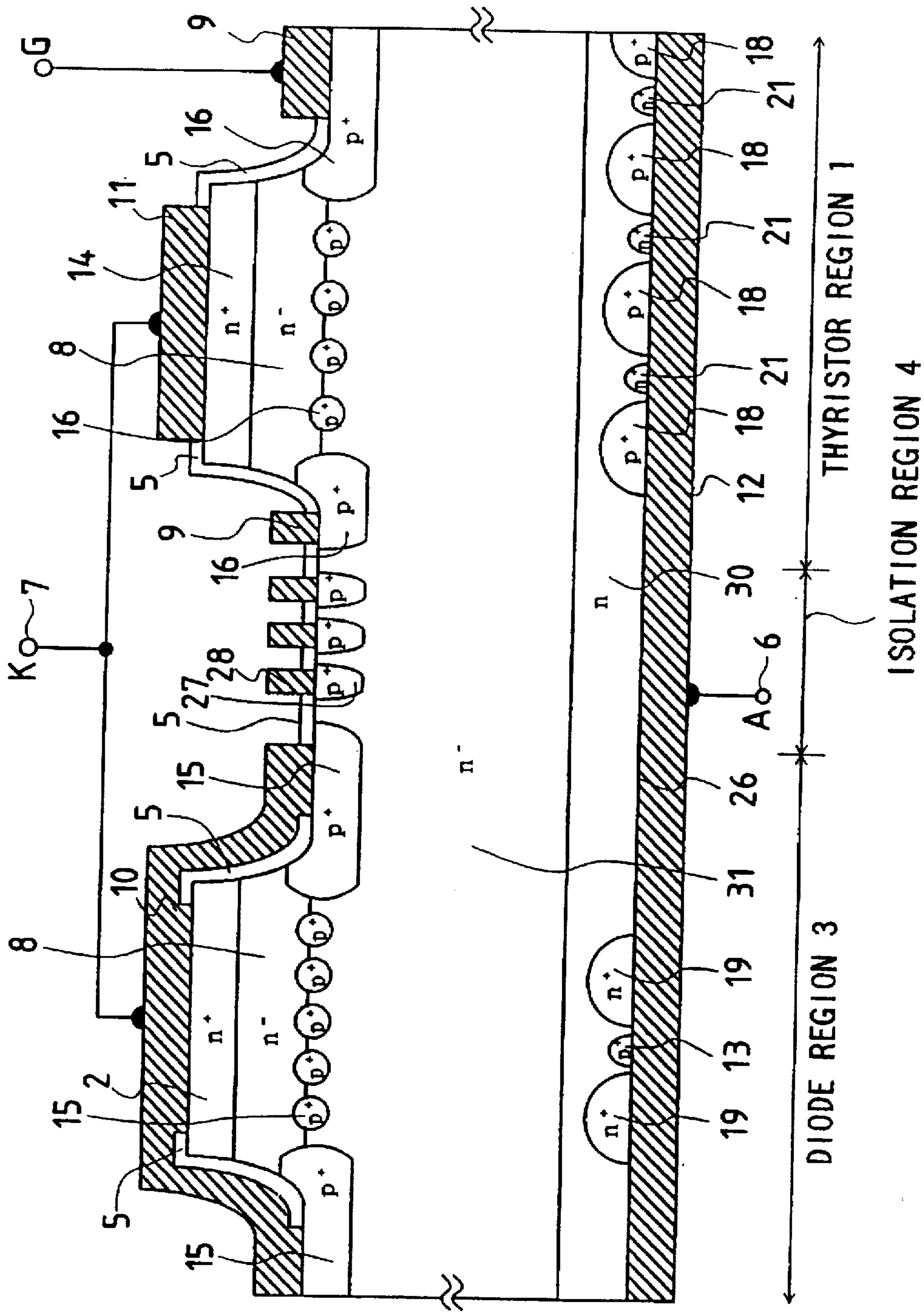
FIG. 22 is a sectional view schematically illustrating a RC thyristor with a buried-gate structure according to a twenty-second embodiment of the present invention.

FIG. 22 schematically illustrates, in section, the RC thyristor of the buried-gate structure according to a twenty-second embodiment of the present invention. In this embodiment, an n buffer layer 30 is formed by epitaxial growth or diffusion in the high-resistivity semiconductor substrate 31 at the anode side of the thyristor region 1, the cathode side of the diode region 3 and in the isolation region 4. The n buffer layer 30 implements a PIN structure in both of the thyristor and diode regions 1 and 3 and hence increases the breakdown voltage of the thyristor, while at the same time it reduces the thickness of the $n^-$ layer 31 and speeds up the thyristor operation. In the n buffer layer 30 there are formed the anode $n^+$ layers 21 and the p emitter layers (thyristor anode regions) 18 at the anode side of the thyristor region 1 and the n emitter layers (the diode cathode regions) 19 and the diode cathode shorted region 13 at the cathode side of the diode region 3. The function of the diode cathode shorted region 13 is to effectively absorb holes from the vicinity of the cathode of the diode region 3 into the diode cathode electrode 12 during the reverse recovery period of the diode as referred to previously with reference to the embodiments of FIGS. 17, 20 and 21.

The anode $n^+$ layer 21 of the thyristor region 1 are shorted to the buffer layer 30. When the shorting ratio of the anode $n^+$ layer 21 to the n buffer layer 30 increases, the thyristor will not latch up; hence, an appropriate shorting ratio of, for example, 30% or less, is needed. The diffusion depth of the p emitter layer (the thyristor anode region) 18 is shown to be smaller than the diffusion depth of the anode $n^+$ layer 21. By changing the depth of the p emitter layer 18, the effective base length of the n buffer layer 30 for holes changes. Hence, the efficiency of injection of holes into the $n^-$ layer 31 can be controlled by selecting the thickness of the n buffer layer 30 and the impurity concentration and diffusion depth of the p emitter layer 18. The impurity concentration of the n buffer layer 30 also affects the hole injection efficiency, and hence cannot be set so high; it is set in the range of, for example, $10^{15}$ to $10^{17}$ $cm^{-3}$. In this embodiment, the $n^+$ regions 19 and 21 can be formed simultaneously, and the $p^+$ regions 13 and 18 can also be formed at the same time.

[Embodiment 23]

Figure 23:
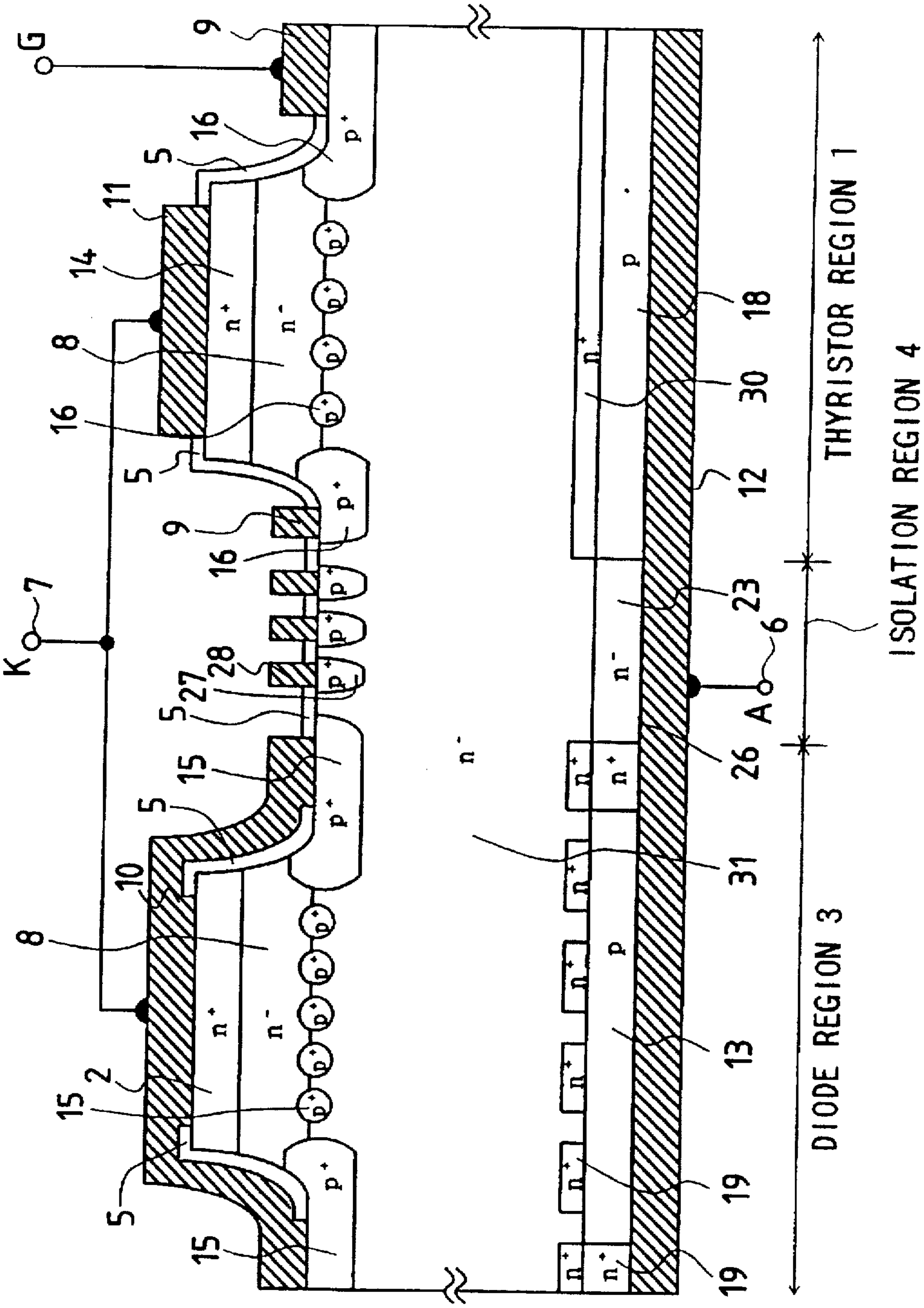
FIG. 23 is a sectional view schematically illustrating a RC thyristor with a buried-gate structure according to a twenty-third embodiment of the present invention.

FIG. 23 schematically illustrates, in section, the RC thyristor of the buried-gate structure according to a twenty-third embodiment of the present invention. In this embodiment either of the thyristor region 1 and the diode region 3 has the buried structure in the first main surface region of the high-resistivity semiconductor substrate 31 as in Embodiments 16 through 22, and the cathode side of the diode region 3 also has the buried structure. In this instance, n emitter layers (diode cathode regions) 19 are formed, as buried layers, simultaneously with the n buffer layer 30 and are shorted to the diode cathode electrode 12 with a fixed shorting pitch. The formation of an epitaxial layer 23 is followed by the formation of the p emitter layer (the thyristor anode region) 18 and the diode cathode shorted region 13. In this embodiment the diode region 3 forms an SI diode which has the buried structure at the both anode and cathode sides, whereas the thyristor region 1 forms an SI thyristor of the buried-gate structure having the n buffer layer 30. With the buried n emitter layers (the diode cathode regions) 19, a high breakdown voltage can easily be obtained in the diode region 3. Further, since the diode cathode shorted region 13 can be formed large, holes can be absorbed into the diode cathode electrode 12 with higher efficiency.

[Embodiment 24]

Figure 24:
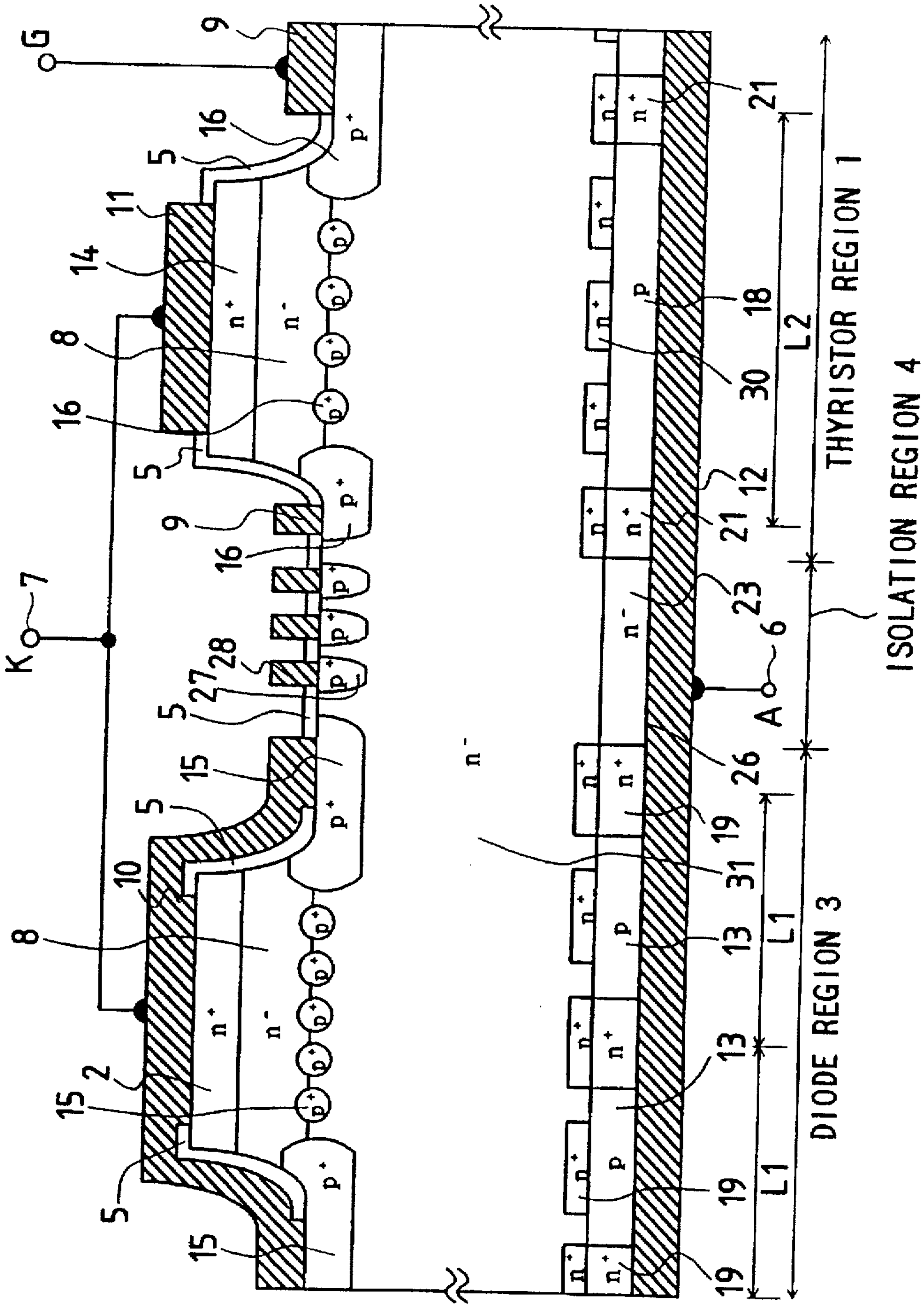
FIG. 24 is a sectional view schematically illustrating a RC thyristor with a buried-gate structure according to a twenty-fourth embodiment of the present invention.

FIG. 24 schematically illustrates, in section, the RC thyristor of the planar-gate structure according to a twenty-fourth embodiment of the present invention. This embodiment features the introduction of an SI buffer structure in the thyristor region 1. The SI buffer structure is already disclosed in Japanese Pat. Appln. No. 114140/92 entitled "Semiconductor Device with Static Induction Buffer Structure". In FIG. 24, the shorting pitch L2 of the anode $n^+$ layers 21 formed at the anode side of the thyristor region 1 is set to a value within twice the diffusion length Ln of electrons. The pitch with which n buffer layers 30 are formed as buried layers may be about the same as the pitch of the thyristor gate regions 16. Similarly, the pitch of the n emitter layers (diode cathode regions) 19 may be about the same as the pitch of the diode anode regions 15. The shorting pitch L1 of the diode cathode regions 19 to the diode cathode electrode 12 is set to a value sufficiently smaller than twice the diffusion length Ln of electrons. The reason for this is that a contact is formed with each of the diode cathode regions 19 and that a latch-up by the thyristor structure needs to be prevented.

[Embodiments 25–28]

FIGS. 25 through 28 schematically illustrates, in section, RC thyristors of the buried-gate structure according to twenty-fifth to twenty-eighth embodiments of the present invention, all of which have the n buffer layer 30 and are modified forms of the FIG. 22 embodiment.

Figure 25:
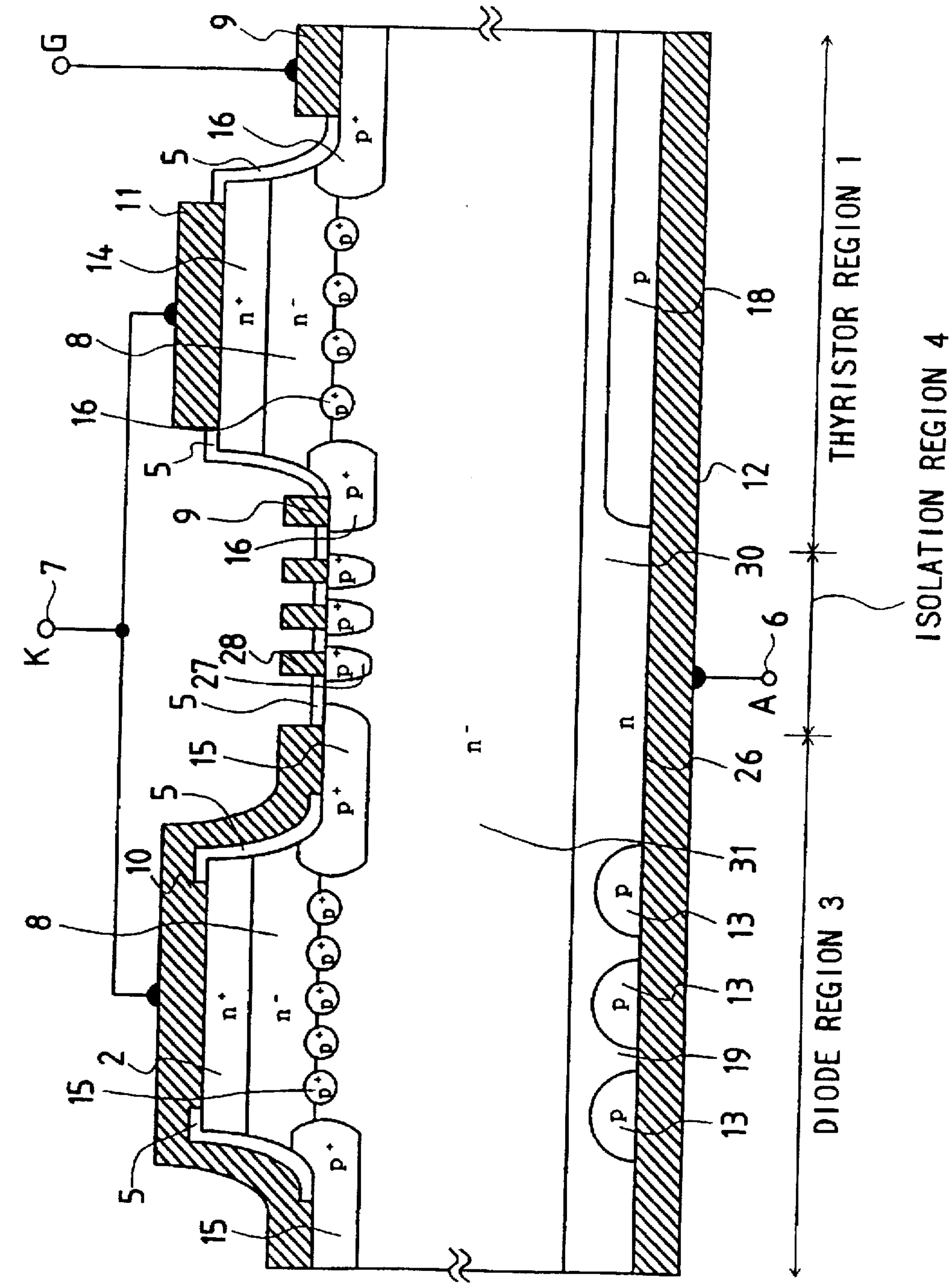
FIG. 25 is a sectional view schematically illustrating a RC thyristor with a buried-gate structure according to a twenty-fifth embodiment of the present invention.
Figure 26:
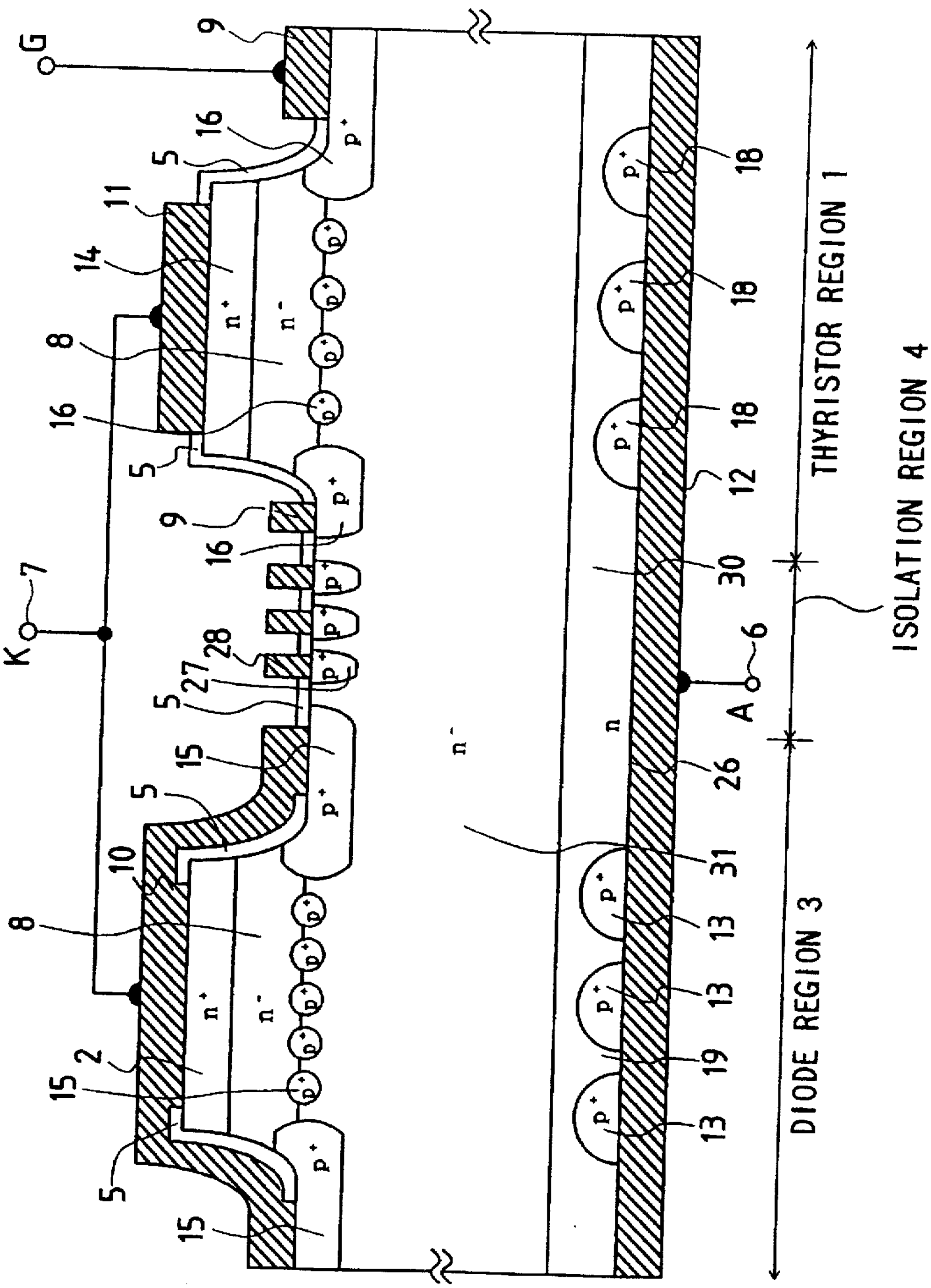
FIG. 26 is a sectional view schematically illustrating a RC thyristor with a buried-gate structure according to a twenty-sixth embodiment of the present invention.
Figure 27:
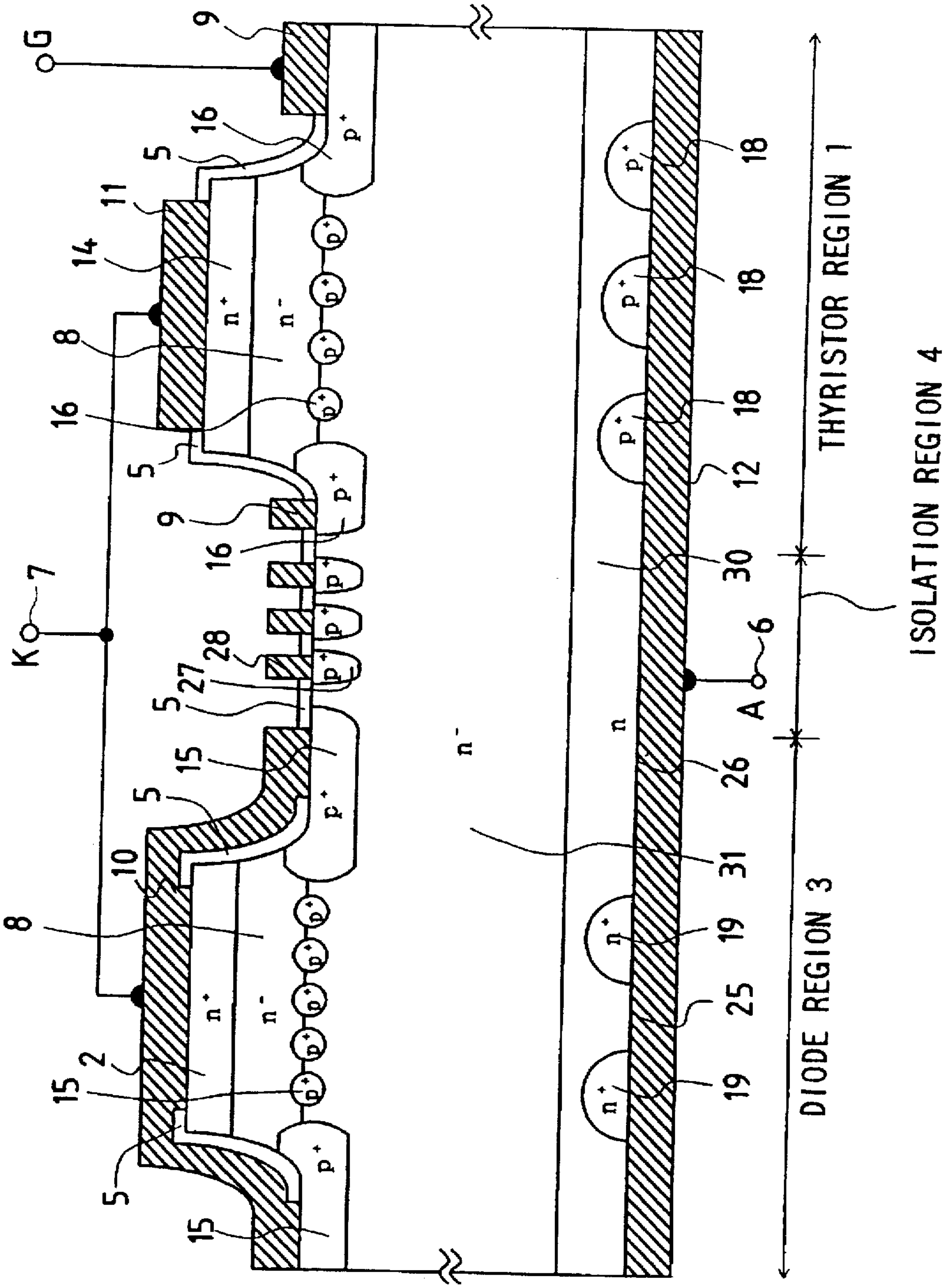
FIG. 27 is a sectional view schematically illustrating a RC thyristor with a buried-gate structure according to a twenty-seventh embodiment of the present invention.
Figure 28:
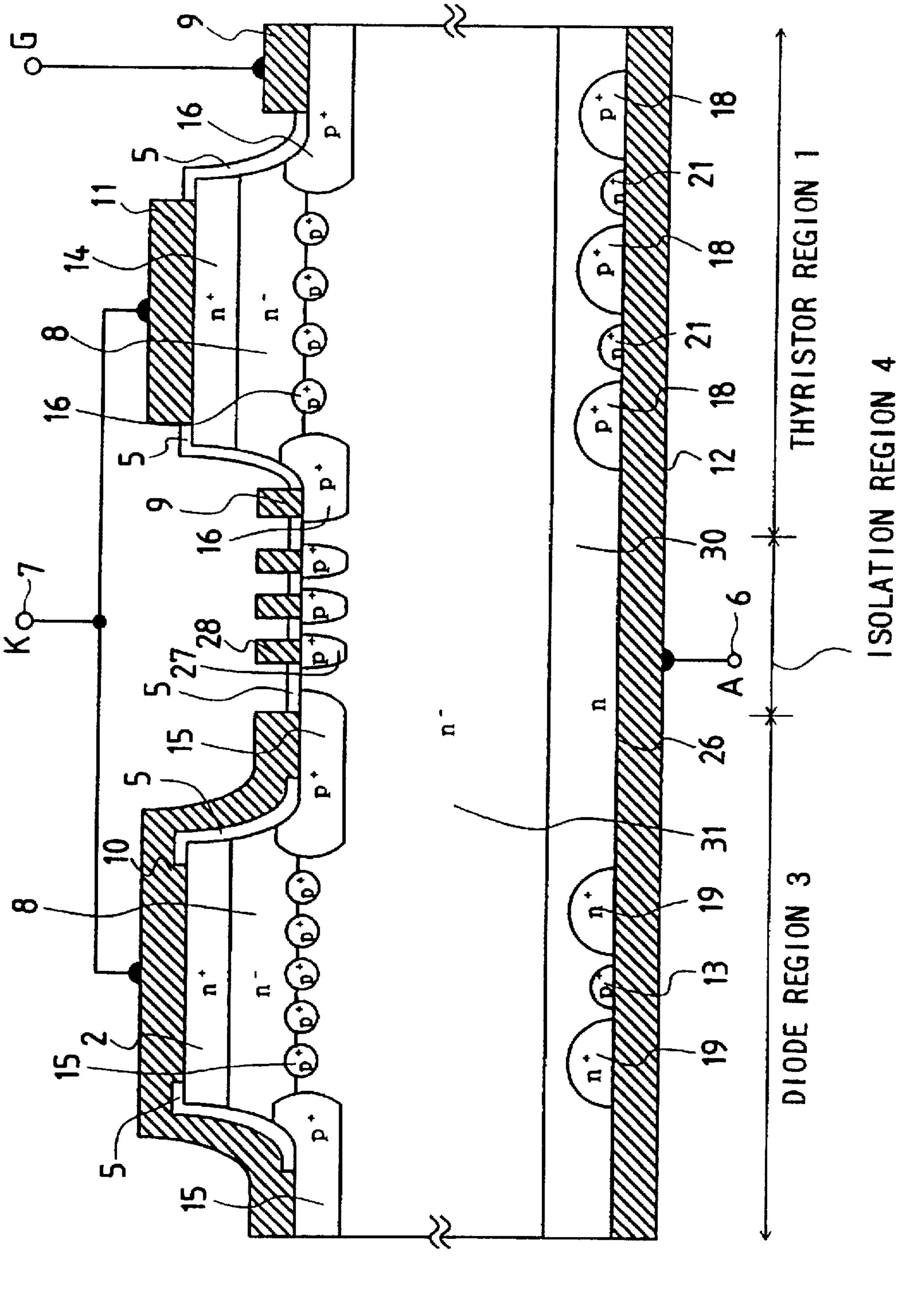
FIG. 28 is a sectional view schematically illustrating a RC thyristor with a buried-gate structure according to a twenty-eighth embodiment of the present invention.

In the FIG. 25 embodiment the n buffer layer 30 is formed in common to the thyristor region 1, the diode region 3 and the isolation region 4; the thyristor region 1 and the diode region 3 have the p emitter layer (the thyristor anode region) 18 and the diode cathode shorted regions 13 respectively formed in the n buffer layer 30 simultaneously by diffusion. Further, the n buffer layer 30 serves as regions common to the diode cathode regions 19 of the diode region 3. In the embodiment of FIG. 26, there are formed wave-shaped p emitter layers (thyristor anode regions) 18 in the thyristor region 1. According to the embodiment of FIG. 27, the wave-shaped p emitter layers (thyristor anode regions) 18 are formed in the thyristor region 1, but in the diode region 3 n emitter layers (diode cathode regions) 19 are spaced a predetermined distance apart, between which a Schottky contact is formed. In the FIG. 28 embodiment, the thyristor region 1 and the diode region 3 have anode $n^+$ layers 21 and the diode cathode shorted region 13, respectively, formed in the n buffer layer 30 in addition to the layers 18 and 19. With this construction, at the anode side of the thyristor region 1 electrons in the n buffer layer 30 can effectively be absorbed into the thyristor anode electrode 12 through the anode $n^+$ layers 21, whereas at the cathode side of the diode region 3 holes can effectively be absorbed into the diode cathode electrode.

In any of the constructions shown in FIGS. 25 to 28, the thickness of the $n^-$ layer 31 can be reduced in the diode region 3 and the thyristor region 1 by the formation of the n buffer layer 30 common thereto and the PIN-structured thyristor and diode regions 1 and 3 allow ease in obtaining a high breakdown voltage. Further, the diode and thyristor regions 1 and 3 are both capable of high-speed switching.

[Embodiment 29]

Figure 29:
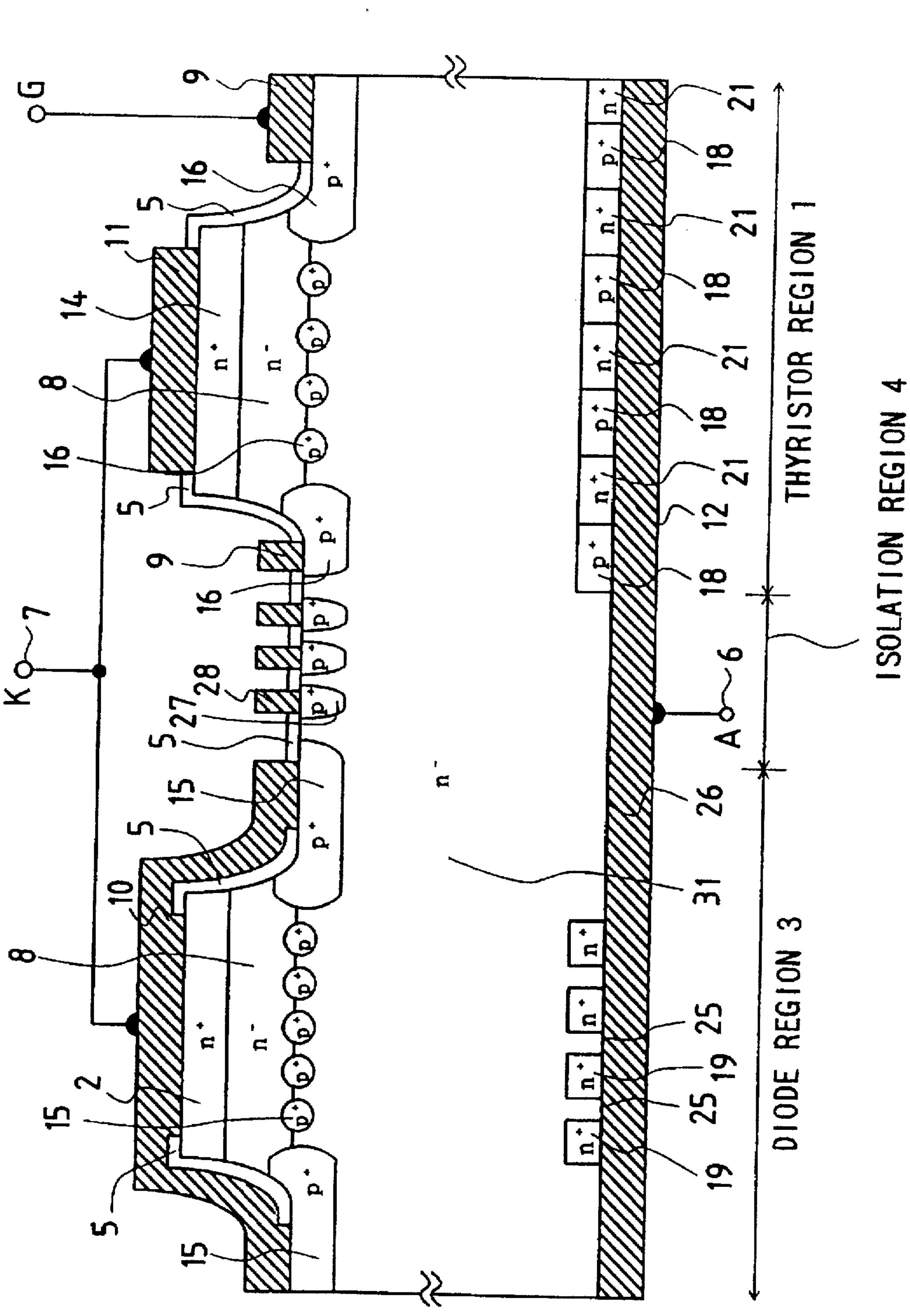
FIG. 29 is a sectional view schematically illustrating a RC thyristor with a buried-gate structure according to a twenty-ninth embodiment of the present invention.

FIG. 29 schematically illustrates, in section, the RC thyristor of the planar-gate structure according to a twenty-ninth embodiment of the present invention. In this embodiment, the thyristor region 1 employs a conventional anode shorted structure containing the anode $n^+$ layers 21 and the p emitter layers 18 and the diode region 3 has diode cathode regions 19 spaced a predetermined distance apart. The $n^+$ layers 19 and 21 can be formed simultaneously.

[Embodiment 30]

Figure 30:
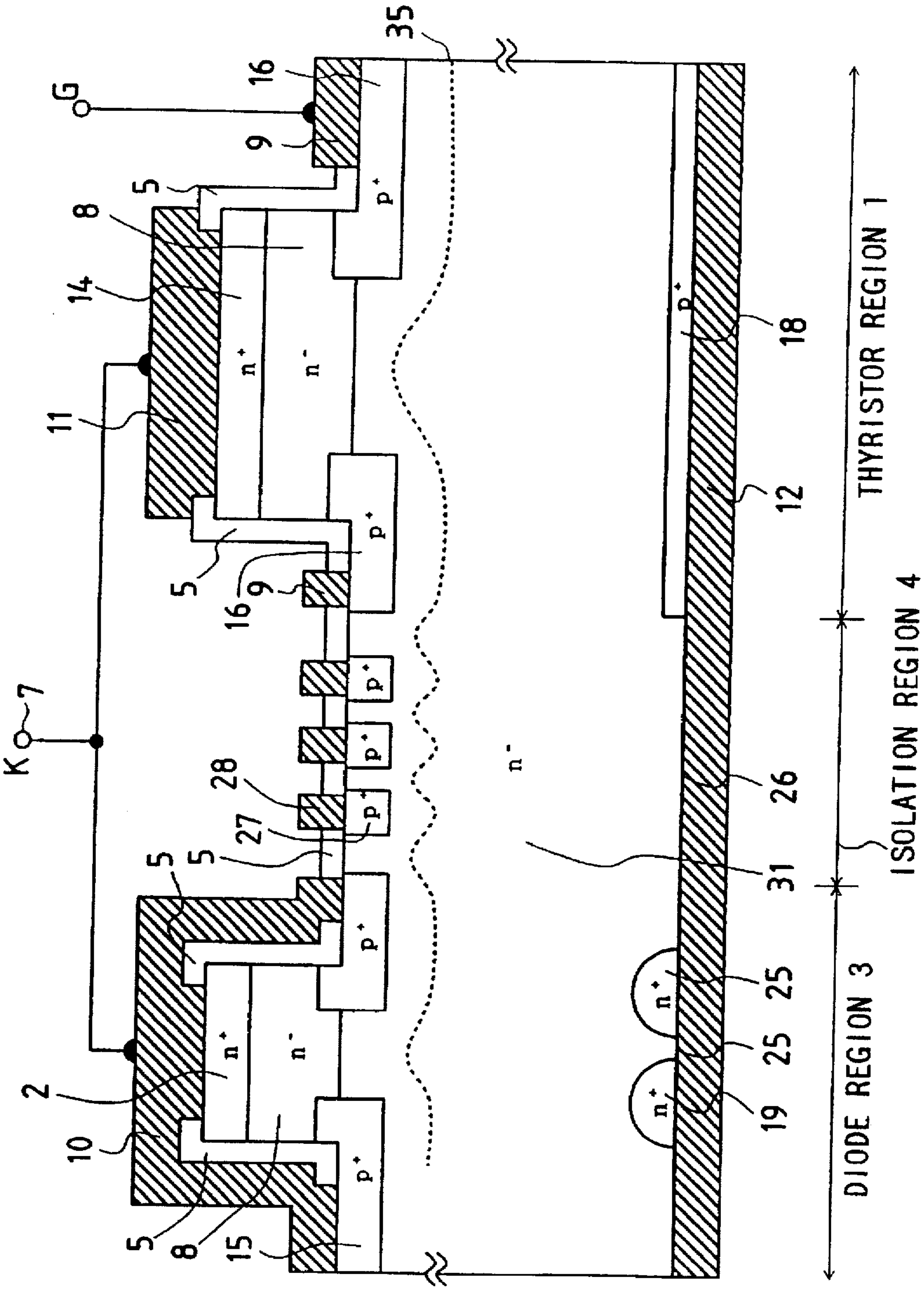
FIG. 30 is a sectional view schematically illustrating a RC thyristor with a recessed-gate structure according to a thirtieth embodiment of the present invention.

FIG. 30 schematically illustrates, in section, the RC thyristor of the buried-gate structure according to a thirtieth embodiment of the present invention. In this embodiment the thyristor region is formed as an SI thyristor of the recessed-gate structure and the diode region as an SI diode of the recessed structure.

In FIG. 30, reference numerals 1, 3 and 4 denote the thyristor region, the diode region and an isolation region, respectively, all formed in a high-resistivity semiconductor substrate 31. In a first main surface of the high-resistivity semiconductor substrate (an n base layer) 31, there are formed p base (gate) layers 16 and an n emitter (cathode) layer 14 of the thyristor region 1, p emitter (anode) layers 15 and a diode anode shorted region 2 of the diode region and $p^+$ layers 27 of the isolation region 4. In a second main surface of the high-resistivity semiconductor substrate 31 there are formed a p emitter (anode) layer 18 and n emitter (cathode) layers 19 of the diode region 3. In the isolation region 4 there is formed an isolation Schottky contact 26. In this embodiment there is formed a Schottky contact 26 between the n emitter layers 19 of the diode region 3. The function of the Schottky contact 25 is to suppress the injection of electrons from the diode cathode and facilitate the absorption of holes by a diode cathode electrode 12 (a global anode electrode) which are injected from the diode anode region (p emitter layer 15). The isolation Schottky contact 26 is to suppress latch-up in the isolation region 4 and prevent an extra injection of electrons into the diode region 3.

In the RC thyristor of this embodiment, too, a diode anode electrode 10 is held equipotential with a thyristor cathode electrode 11 via a global cathode electrode 7, and the diode cathode electrode is held equipotential with the thyristor anode electrode 12 via a global anode electrode 6. Further, the diode anode shorted region 2 is shorted to the diode anode region 15 via the diode anode electrode 10. With the effect of shorting by diode anode shorted region 2, electrons which are distributed near the anode region 15 of the diode region 3 can be absorbed into the diode anode electrode 10 through the diode anode shorted region 2. Electrons in an $n^-$ layers (31 and 8) near the $n^+$ diode anode shorted region 2, surrounded by a depletion layer spreading from the diode anode region 15 into the high-resistivity layer ($n^-$) 31, are surrounded by a potential barrier during the reverse recovery period of the diode; hence, the electrons are not injected into the diode cathode side but are rather absorbed by the diode anode electrode 10. This reduces the quantity of charges that are stored during the reverse recovery period and improves the reverse recovery performance of the diode, providing a high-speed switching characteristic. When a high-speed thyristor such as an SI thyristor is used as the main thyristor, it is desirable to use a diode which is small in the quantity of charges stored during the reverse recovery period, small in heating value and can be turned off at high speed.

The FIG. 30 embodiment employs an SI diode of the recessed structure in the diode region 3 and an SI thyristor of the recessed-gate structure in the main thyristor region 1, and hence can be manufactured with much ease. What is more important resides in that the SI diode can be expected to have switching performance substantially comparable to that of the SI thyristor which is dependent on the RC time constant between its gate and cathode at the input side, since the diode region 3 can be formed with a pattern pitch reduced down to about the same extent as that usable for the formation of the gate of the thyristor of the recessed-gate structure. In terms of the operation of the SI diode the absorption of electrons from the $n^+$ diode anode region 2 significantly affects the reverse recovery characteristic of the SI diode as referred to previously; yet the SI diode having its anode region formed with the same pattern size as that of the SI thyristor can be expected to produce the same SI effect as that by the SI thyristor. This is associated with the rate at which the depletion layer spreads into the high-resistivity layer 31 from the diode anode region 15, and during the reverse recovery period of the diode it is desirable that the $n^+$ shorted region 2 be immediately shielded by the depletion layer which spreads into the $n^-$ layer (31) from the $p^+$ layer (15). The recessed structure is excellent in this respect as well. To perform this, it is necessary that the anode region of the diode region and its vicinity be formed in the same manner as the region between the gate and cathode of the SI thyristor of the recessed-gate structure.

In the FIG. 30 embodiment the thyristor region 1 has the p emitter layer 18 at the anode side. The suppression of a tail current at the turn-OFF of the thyristor is an important parameter for enhancement of the switching characteristic. Also in the RC-SI thyristor, the tail component needs to be suppressed; lifetime control by irradiation with an electron beam or the like is necessary in the FIG. 30 embodiment, too.

At the cathode side of the diode region 3 there are disposed the n emitter layers 19 in the form of stripes or islands with a view to suppressing the injection of electrons from the diode cathode side and increasing the hole absorption efficiency as mentioned previously.

In the isolation region 4 there are disposed in the first main surface of the substrate 31 the plurality of ring-shaped $p^+$ layers 27 surrounding the main thyristor region 1. The $p^+$ layers 27 are equally spaced apart. To maintain potential stability, the $p^+$ layers 27 are each covered with a metal electrode 28.

Since the device structure of the FIG. 30 embodiment can be manufactured by a recessed-gate fabrication process, the $p^+$ regions 15, 27 and 16 of the diode, isolation and thyristor regions 3, 4 and 1 can be simultaneously formed by selectively removing an insulating layer 5 as of $SiO_2$ through patterning to form windows and diffusing an impurity therethrough into the semiconductor substrate 31. In this case, ions of boron (B) may also be implanted. The n epitaxial layers 8 can also be formed at the same time. Similarly, the $n^+$ regions 2 and 14 of the diode and thyristor regions 3 and 1 can also be formed simultaneously with the n epitaxial layers 8 by diffusion or implantation of ions of phosphorus (p), arsenic (As) or the like. The isolation region 4 is shown to have three $p^+$ layers 27 but need not be limited specifically to the illustrated structure and may also be formed as a structure called a successively interconnected junction structure disclosed in, for example, Japanese Pat. Appln. No. 337823/94 entitled "Reverse Conducting Static Induction Thyristor" filed in the name of the assignee of this application. Other simple structure can be used for the isolation region as long as they have fabrication process compatibility with the main thyristor region 1 and the diode region 3.

It is a major characteristic of the FIG. 30 embodiment that the $p^+$ diode anode regions 15, the n epitaxial layer 8 and the $n^+$ diode anode region 2 of the SI diode region can be formed simultaneously with the gate regions 16, the n epitaxial layer 8 and the $n^+$ thyristor cathode region 14 of the SI thyristor of the recessed-gate structure. The pattern size or channel width of the recessed structure may be common to the thyristor region 1 and the diode region 3. Further, the pattern size or spacing of the $p^+$ layers 27 of the isolation region 4 may be the same as that of the recessed structure of the thyristor region 1 or diode region 3.

When the SI thyristor region 1 has the normally-ON characteristic, however, the pattern size of the $p^+$ diode anode regions 15 of the recessed structure needs to be set smaller than the pattern pitch of the $p^+$ recessed-gate regions 16 of the thyristor region 3 since the SI diode region 3 is always required to have the normally-OFF characteristic. In this instance, it is necessary that channel regions defined between the $p^+$ layers 15 be interconnected by a depletion layer spreading from the diode anode regions 15 into the $n^-$ epitaxial layer 8 and the high-resistivity semiconductor substrate 31, forming a sufficient barrier against electrons in the $n^+$ diode anode shorted region 2.

The FIG. 30 embodiment has a construction wherein the SI thyristor of the recessed-gate structure and the SI diode of the recessed structure, connected thereto in antiparallel relation, are formed simultaneously. It is an important feature of this embodiment that the high breakdown voltage, high-speed SI diode of the recessed structure, which well fits the high-speed operation of the SI thyristor and has fabrication process compatibility therewith as well, is formed simultaneously with the SI thyristor.

It is a matter of course that the constructions used at the diode cathode side and the thyristor anode side in the embodiments of FIGS. 17 to 29 can be used in the RC thyristor of the recessed-gate structure. For example, the diode cathode side may be formed as the diode cathode shorted structure, enlarged diode cathode shorted structure, structure with the n buffer layer, SI type buried structure, or the like. The thyristor anode side may be formed as the wave-shaped p emitter structure, SI anode shorted structure, structure with the n buffer layer, SI buffer structure, drift buffer structure, conventional anode shorted structure, of the like.

[Embodiment 31]

Figure 31:
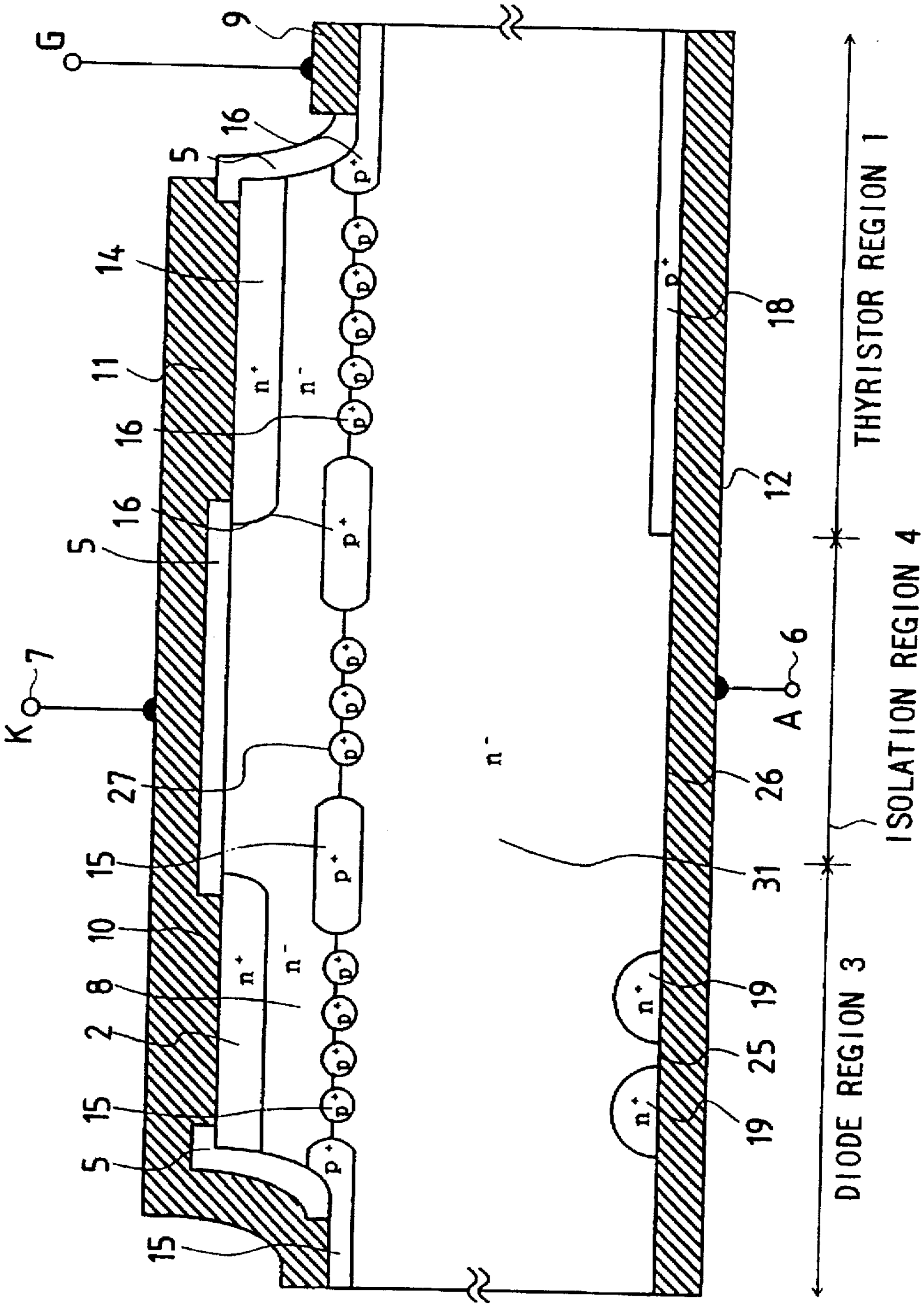
FIG. 31 is a sectional view schematically illustrating a RC thyristor with a recessed-gate structure according to a thirty-first embodiment of the present invention.

FIG. 31 schematically illustrates, in section, the RC thyristor of the buried-gate structure according to a thirty-first embodiment of the present invention. A structural feature of this embodiment lies in the configuration of the isolation region 4. In Embodiments 16 to 29 the isolation region 4 has its $p^+$ layers 27 formed in the high-resistivity semiconductor substrate 31 exposed by selectively etching away the $n^+$ layers (14, 2) and the $n^-$ layer 8, whereas this embodiment employs the buried structure for the $p^+$ layers 27. The reason for this is that the buried structure can be used in the isolation region 4 if a predetermined high-resistivity can be maintained between the diode anode region 15 and the thyristor gate region 16. Thus the RC thyristor of the buried-gate structure according to this embodiment is characterized by the buried structure of the isolation region. The construction of this embodiment at the diode cathode side and the thyristor anode side is identical with the construction of the FIG. 16 embodiment.

[Embodiment 32]

Figure 32:
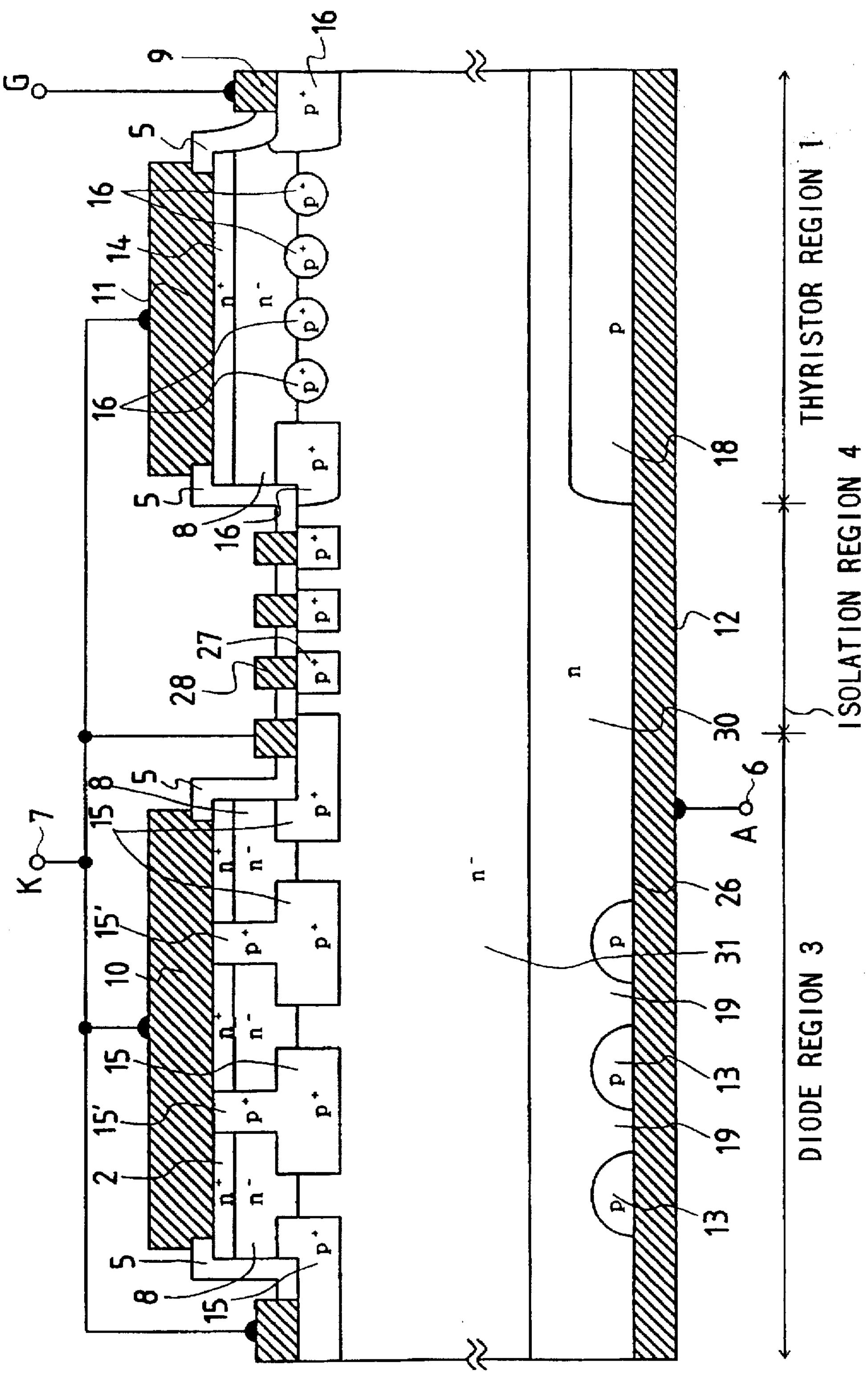
FIG. 32 is a sectional view schematically illustrating a RC thyristor with a recessed-gate structure according to a thirty-second embodiment of the present invention.

FIG. 32 schematically illustrates, in section, the RC thyristor of the buried-gate structure according to a thirty-second embodiment of the present invention. A structural feature of this embodiment lies in the diode anode side. That is, an SI diode of the buried structure has relatively large diode anode regions 15 formed as buried layers and $p^+$ diffused region 15' formed in each diode anode region 15 for contact with the diode anode electrode 10. Such relatively large $p^+$ diode anode regions 15 enables holes to be injected into a deeper region of the high-resistivity semiconductor substrate 31 or absorbed therefrom during the reverse recovery period; furthermore, since each $p^+$ region 15 makes contact with the diode anode electrode 10 via the $p^+$ diffused region 15', the depletion layer which spreads into channel regions during the reverse recovery period responds at high speed, making it possible to absorb more electrons into the diode anode shorted regions 2 from the $n^-$ layers 8 and 31 near the diode anode side.

While the constructions of the diode cathode side and the thyristor anode side are the same as those in the FIG. 25 embodiment, it is a matter of course that the constructions in Embodiments 16 to 24 or 26 to 29 can be used in this embodiment.

[Embodiment 33]

Figure 33:
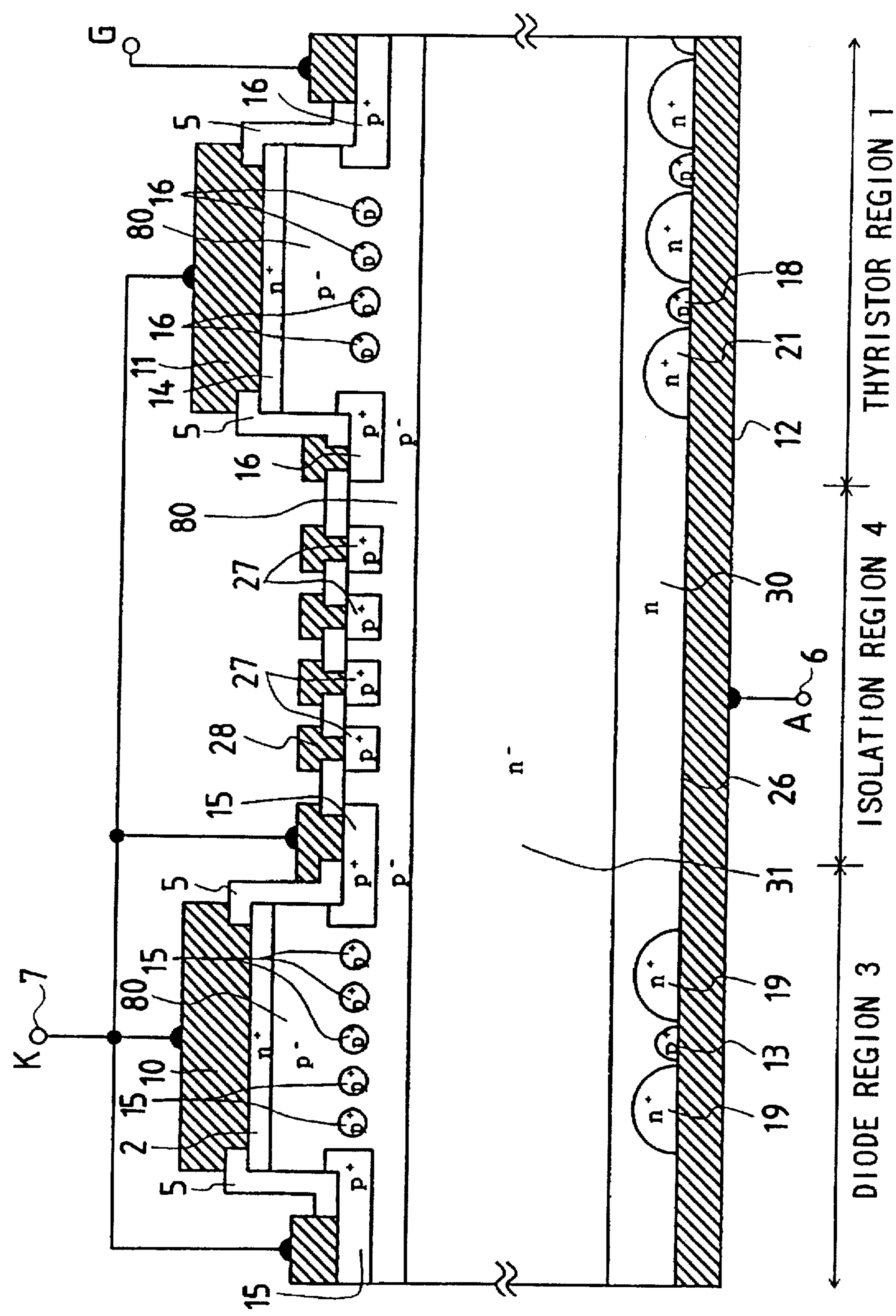
FIG. 33 is a sectional view schematically illustrating a RC thyristor with a recessed-gate structure according to a thirty-third embodiment of the present invention.

FIG. 33 schematically illustrates, in section, the RC thyristor of the buried-gate structure according to a thirty-third embodiment of the present invention. This embodiment has its structural feature in that the main thyristor region 1 is formed as a GTO having the buried-gate structure (16) formed in a $p^-$ epitaxial layer 80 and that the diode region 3 is formed as an SI diode having the diode anode regions 15 also buried in the $p^-$ epitaxial layer 80. While in this embodiment the isolation region 4 is also formed in the $p^-$ epitaxial layer 80, other simple isolation structures can be employed.

This embodiment is particularly advantageous in the fabrication of a device with the normally-OFF characteristic.

The fabrication process compatibility can be obtained by forming the thyristor region as a buried-gate GTO of the normally-OFF characteristic and the diode region as an SI diode of the buried structure which allows ease in obtaining the normally-OFF characteristic. The $p^-$ epitaxial layer 80 may be formed shallower, for example, to a depth of the $p^+$ layer (15, 27, 16). In this case, it can be considered that the $p^-$ epitaxial layer 80 is formed in place of the $n^-$ epitaxial layer 8 in the embodiments of FIGS. 16 to 29. That is, the RC thyristor of this embodiment has the buried-gate SI thyristor of the normally-OFF characteristic and the buried-structured SI diode connected thereto in antiparallel relation and easy to obtain the normally-OFF characteristic.

Although in this embodiment the thyristor anode side and the diode cathode side have the same constructions as in the FIG. 22 embodiment, it is a matter of course that other structures, that is, the structures in the embodiments of FIGS. 16 to 21 or 23 to 29 can be used.

The above-described embodiments of FIGS. 16 to 33 are merely illustrative of the present invention and can be modified and enlarged in various ways. For example, the main thyristor region may be formed as a MOS-controlled thyristor or MOS-controlled SI thyristor of the buried-gate or recessed-gate structure. The MOS-controlled thyristor of the buried-gate or recessed-gate structure is disclosed in, for example, Japanese Pat. Appln. No. 129678/92 (Pat. Pub. No. 85433/94) entitled "Vertical MOS-Controlled Thyristor" (U.S. Pat. No. 5,324,966).

As regards the diode region, Embodiments 1 to 15 may employ the construction disclosed in Japanese Pat. Appln. No. 204434/92 entitled "Static Induction Diode of Planar Structure" and Embodiments 16 to 33 may adopt the construction disclosed in Japanese Pat. Appln. No. 210751/92 entitled "Static Induction Diode of Buried or Recessed Structure".

When the MOS-controlled thyristor is used, the gate could be driven with ease, besides the operation of the SI diode connected to the main thyristor in antiparallel relation thereto would be promoted since the main thyristor is turned off by a built-in p-channel MOSFET as well, as referred to previously.

The RC thyristor with the planar-gate structure according to the present invention has the planar structure, and hence is easy to manufacture. The RC thyristor of the invention possesses high-speed switching performance and reverse recovery characteristic since it has the SI thyristor of the planar-gate structure and the SI diode of the planar structure. By the introduction of the buffer structure in common to the thyristor and diode regions at their anode side, it is possible to increase the breakdown voltages of the thyristor and diode regions and speed up their operations.

The breakdown voltage of the RC thyristor with the buried-gate or recessed-gate structure according to the present invention can easily be increased since it has the buried-gate or recessed-gate structure, and high current switching performance can easily be obtained by using a multichannel structure. The RC thyristor possesses high voltage, high current and high-speed switching performance since it has the SI thyristor of the buried-gate or recessed-gate structure and the SI diode of the buried-gate or recessed-gate structure. By the introduction of the buffer structure in common to the thyristor and diode regions at their anode side, it is possible to increase the breakdown voltages of the thyristor and diode regions and speed up their operations.

Moreover, according to the RC thyristor with the buried-gate or recessed-gate structure of the present invention, the thyristor and diode regions can be simultaneously formed by a buried or recessed structure fabrication process; hence, the fabrication process compatibility is excellent. It is also a marked advantage that the diode comparable to the high-speed operations of the thyristor can be fabricated simultaneously therewith. That is to say, the SI diode of the buried structure is suitable for use with the SI thyristor of the buried-gate structure in terms of breakdown voltage, current capacity and switching performance, and the SI diode of the recessed structure is suitable for use with the SI thyristor of the recessed-gate structure that has high-speed performance as compared with the SI thyristor of the buried-gate structure.

It will be apparent that many modifications and variations may be effected without departing from the scope of the novel concepts of the present invention.

What is claimed is:

1. A reverse conducting thyristor with a planar-gate structure which has a thyristor region and a diode region, characterized in:

that said thyristor region comprises a gate region formed in a first main surface of a semiconductor substrate, a cathode region formed in said first main surface of said semiconductor substrate and surrounded by said gate region, and a thyristor anode region formed in a second main surface of said semiconductor substrate;

that said diode region comprises a diode anode region formed in said first main surface of said semiconductor substrate, a diode anode shorted region formed in said first main surface of said semiconductor substrate and surrounded by said diode anode region, and a diode cathode region formed in said second main surface of said semiconductor substrate;

that said diode anode region of said diode region and said gate region of said thyristor region, both formed in said first main surface of said semiconductor substrate, are isolated by an isolation region formed in said first main surface of said semiconductor substrate;

that said diode cathode region and said thyristor anode region, both formed in said second main surface of said semiconductor substrate, are held equipotential via a global anode electrode formed on said second main surface of said semiconductor substrate;

that said thyristor cathode region, said diode anode region and said diode anode shorted region are held equipotential via a global cathode electrode; and that said diode anode shorted region, surrounded by said diode anode region, is also surrounded by a depletion layer that spreads in said semiconductor substrate owing to the contact potential difference of the PN junction between said diode anode region and said semiconductor substrate and constitutes a static induction diode of a planar structure in combination with said diode cathode region, said diode anode region, said diode anode shorted region, said thyristor gate region and said thyristor cathode region each being formed as a planar structure in said first main surface of said semiconductor substrate.

2. The reverse conducting thyristor with a planar-gate structure of claim 1, wherein said thyristor cathode region is formed in said thyristor gate region and constitutes a gate-turnoff thyristor of a planar-gate structure in combination with said thyristor anode region.

3. The reverse conducting thyristor with a planar-gate structure of claim 1, wherein said thyristor cathode region, surrounded by said thyristor gate region, is also surrounded by a depletion layer which spreads in said semiconductor substrate owing to the contact potential difference of the PN junction between said thyristor gate region and said semiconductor substrate and constitutes a static induction thyristor of a planar-gate structure in combination with said thyristor anode region.

4. A thyristor in accordance with claim 1, wherein:

said depletion layer is completely depleted.

5. A thyristor in accordance with claim 1, wherein:

said cathode region of said thyristor is spaced from said gate region and both of said thyristor cathode region and said gate region are formed into said semiconductor substrate.

6. A thyristor in accordance with claim 1, wherein:

said anode region of said diode is spaced from said gate region in said semiconductor substrate.

7. A thyristor in accordance with claim 1, wherein:

said anode shorted region of said diode is spaced from said gate region in said semiconductor substrate.

8. A thyristor in accordance with claim 1, wherein:

said gate region is of a different conductivity type than said semiconductor substrate.

9. A thyristor in accordance with claim 1, wherein:

said diode anode region is of a different conductivity type than said semiconductor substrate.

10. A thyristor in accordance with claim 1, wherein:

said thyristor cathode region is of a same conductivity type as said semiconductor substrate.

11. A thyristor in accordance with claim 1, wherein:

said diode anode shorted region is of a same conductivity type as said semiconductor substrate.

12. A thyristor in accordance with claim 1, wherein:

a contact potential difference between said semiconductor substrate and said gate region controls a height of a potential barrier of a region of said semiconductor substrate outside said gate region and outside said thyristor cathode region.

13. A thyristor in accordance with claim 1, wherein:

said thyristor cathode region is surrounded by an essentially depleted region of said semiconductor substrate with electron injection from said thyristor cathode region into said semiconductor substrate being controlled by a potential of said gate region.

14. A reverse conducting thyristor with a buried-gate structure which has a thyristor region and a diode region, characterized in:

that said thyristor region comprises a buried-gate region formed in a first main surface of a semiconductor substrate, a cathode region formed in said first main surface of said semiconductor substrate above said buried-gate region with an epitaxial layer interposed therebetween, and a thyristor anode region formed in a second main surface of said semiconductor substrate;

that said diode region comprises a diode anode region formed as a buried structure in said semiconductor substrate in the vicinity of its first main surface, a diode anode shorted region formed in said first main surface of said semiconductor substrate above said diode anode region with said epitaxial layer interposed therebetween, and a diode cathode region formed in said second main surface of said semiconductor substrate;

that said diode cathode region of said diode region and said buried-gate region of said thyristor region, both formed in said first main surface of said semiconductor substrate, are isolated by an isolation region formed in said first main surface of said semiconductor substrate;

that said diode cathode region and said thyristor anode region, both formed in said second main surface of said semiconductor substrate, are held equipotential via a global anode electrode formed on said second main surface of said semiconductor substrate;

that said thyristor anode region, said diode anode region and said diode anode shorted region are held equipotential via a global cathode electrode; and that said diode anode shorted region, surrounded by said diode anode region, is also surrounded by a depletion layer that spreads in said semiconductor substrate owing to the contact potential difference of the PN junction between said diode anode region and said semiconductor substrate and constitutes a static induction diode of a buried structure in combination with said diode cathode region each of said diode anode region and said thyristor gate region being formed as a buried structure in said semiconductor substrate in the vicinity of its first main surface.

15. The reverse conducting thyristor with a buried-gate structure of claim 14, wherein said thyristor cathode region is formed in said first main surface of said semiconductor substrate in a thyristor base region containing said buried-gate region and constitutes a gate-turn-off thyristor of a buried-gate structure in combination with said thyristor anode region.

16. The reverse conducting thyristor with a buried-gate structure of claim 14, wherein said thyristor cathode region is surrounded by said thyristor gate region of said buried-gate structure and a depletion layer which spreads in said semiconductor substrate owing to the contact potential difference of the PN junction between said thyristor gate region of said buried-gate structure and said semiconductor substrate and constitutes a static induction thyristor of a buried-gate structure in combination with said thyristor anode region.

17. A reverse conducting thyristor with a recessed-gate structure which has a thyristor region and a diode region, characterized in:

that said thyristor region comprises a recessed-gate region formed in a first main surface of a semiconductor substrate, a cathode region formed in said first main surface of said semiconductor substrate above said recessed-gate region with an epitaxial layer interposed therebetween, and a thyristor anode region formed in a second main surface of said semiconductor substrate;

that said diode region comprises a diode anode region formed as a recessed structure in said semiconductor substrate in the vicinity of its first main surface, a diode anode shorted region formed in said first main surface of said semiconductor substrate above said diode anode region with said epitaxial layer interposed therebetween, and a diode cathode region formed in said second main surface of said semiconductor substrate;

that said diode anode region of said diode region and said recessed-gate region of said thyristor region, both formed in said first main surface of said semiconductor substrate, are isolated by an isolation region formed in said first main surface of said semiconductor substrate;

that said diode cathode region and said thyristor anode region, both formed in said second main surface of said semiconductor substrate, are held equipotential via a global anode electrode formed on said second main surface of said semiconductor substrate;

that said thyristor cathode region, said diode anode region and said diode anode shorted region are held equipotential via a global cathode electrode; and that said diode anode shorted region is surrounded and shielded by said diode anode region formed as said recessed structure and a depletion layer that spreads in said semiconductor substrate owing to the contact potential difference of the PN junction between said diode anode region and said semiconductor substrate and constitutes a static induction diode of a recessed structure in combination with said diode cathode region, each of said diode anode region and said thyristor gate region being formed as a recessed structure in said semiconductor substrate in the vicinity of its first main surface.

18. The reverse conducting thyristor with a recessed-gate structure of claim 17, wherein said thyristor cathode region is formed in said first main surface of said semiconductor substrate in a thyristor base region containing said recessed-gate region and constitutes a gate-turn-off thyristor of a recessed-gate structure in combination with said thyristor anode region.

19. The reverse conducting thyristor with a recessed-gate structure of claim 17, wherein said thyristor cathode region is surrounded and shielded by said thyristor gate region of said recessed-gate structure and a depletion layer which spreads in said semiconductor substrate owing to the contact potential difference of the PN junction between said thyristor gate region of said recessed-gate structure and said semiconductor substrate and constitutes a static induction thyristor of a recessed-gate structure in combination with said thyristor anode region.

* * * * *